United States Patent
Ohnishi et al.

(10) Patent No.: US 10,933,907 B2
(45) Date of Patent: Mar. 2, 2021

(54) SENSOR DEVICE

(71) Applicant: HITACHI AUTOMOTIVE SYSTEMS, LTD., Hitachinaka (JP)

(72) Inventors: Teruyuki Ohnishi, Atsugi (JP); Makoto Kimura, Yokohama (JP)

(73) Assignee: HITACHI AUTOMOTIVE SYSTEMS, LTD., Hitachinaka (JP)

(*) Notice: Subject to any disclaimer, the term of this patent is extended or adjusted under 35 U.S.C. 154(b) by 162 days.

(21) Appl. No.: 16/334,730

(22) PCT Filed: Mar. 15, 2017

(86) PCT No.: PCT/JP2017/010432
§ 371 (c)(1),
(2) Date: Mar. 19, 2019

(87) PCT Pub. No.: WO2018/055802
PCT Pub. Date: Mar. 29, 2019

(65) Prior Publication Data
US 2019/0270479 A1    Sep. 5, 2019

(30) Foreign Application Priority Data
Sep. 20, 2016  (JP) .............................. JP2016-182554

(51) Int. Cl.
*B62D 5/04* (2006.01)
*G01B 7/30* (2006.01)
(Continued)

(52) U.S. Cl.
CPC .............. *B62D 5/0493* (2013.01); *B62D 5/04* (2013.01); *B62D 5/0463* (2013.01); *G01B 7/30* (2013.01);
(Continued)

(58) Field of Classification Search
CPC ...... B62D 5/04; B62D 5/0463; B62D 5/0484; B62D 5/049; B62D 5/0493; B62D 6/10;
(Continued)

(56) References Cited

U.S. PATENT DOCUMENTS 5,652,487 A * 7/1997 Nishino ............... B62D 5/0487
                                                      180/446
6,134,491 A * 10/2000 Kawagoe ............... B62D 1/286
                                                      180/410
(Continued)

FOREIGN PATENT DOCUMENTS

JP    H07-034342 U    6/1995
JP    2002-267696 A   9/2002
(Continued)

OTHER PUBLICATIONS

Office Action issued in corresponding Japanese Application No. 2018-540617 dated Dec, 10, 2019.
(Continued)

*Primary Examiner* — Babar Sarwar
(74) *Attorney, Agent, or Firm* — Foley & Lardner LLP

(57) ABSTRACT

The present invention includes: first to fourth Hall elements for detecting steering torque; a first power supply circuit for supplying power to the first and second Hall elements; a second power supply circuit for supplying power to the second and third Hall elements; and a control device including a first abnormality determining unit for determining whether first and fourth torque signals are abnormal by preparing the first torque signal output from the first Hall element with the fourth torque signal output from the fourth Hall element and a second abnormality determining unit for determining whether second and third torque signals are abnormal by comparing the second torque signal output from the second Hall element with the third torque signal output from the third Hall element. With this, even when (Continued)

abnormality occurs in one of the first and second power supply circuits, the abnormality determination of an output signal can be continued.

18 Claims, 15 Drawing Sheets

(51) Int. Cl.
  *G01D 5/14* (2006.01)
  *G01R 33/07* (2006.01)
  *G01D 5/244* (2006.01)
  *G01L 3/10* (2006.01)
(52) U.S. Cl.
  CPC ............. *G01D 5/145* (2013.01); *G01D 5/244* (2013.01); *G01L 3/10* (2013.01); *G01R 33/072* (2013.01)
(58) Field of Classification Search
  CPC . G01B 7/30; G01D 3/08; G01D 5/145; G01D 5/244; G01L 25/003; G01L 3/10; G01L 3/105; G01R 33/072
  See application file for complete search history.

(56) References Cited

U.S. PATENT DOCUMENTS

| | | | | |
|---|---|---|---|---|
| 6,152,254 A * | 11/2000 | Phillips | ............... | B62D 5/0463 180/421 |
| 6,397,969 B1 * | 6/2002 | Kasai | ................... | B62D 5/0481 180/404 |
| 6,445,151 B1 * | 9/2002 | Nakano | ................ | B62D 5/0493 180/165 |
| 6,552,534 B2 * | 4/2003 | Desbiolles | ............. | B62D 15/02 180/400 |
| 6,691,009 B1 * | 2/2004 | Yao | ......................... | B62D 6/002 180/402 |
| 7,504,818 B2 * | 3/2009 | Seki | .................... | G01R 19/2506 324/76.52 |
| 8,278,914 B2 * | 10/2012 | Tanaka | ...................... | G01D 5/06 324/207.25 |
| 8,558,534 B2 * | 10/2013 | Tomita | ............... | B62D 15/0245 324/76.77 |
| 8,924,083 B2 * | 12/2014 | Yoshitake | ............ | B62D 5/0493 701/42 |
| 10,589,782 B2 * | 3/2020 | Takayanagi | ............... | B62D 3/02 |
| 2001/0053952 A1 * | 12/2001 | Kodaka | ................. | B62D 5/0484 701/43 |
| 2004/0238258 A1 * | 12/2004 | Ono | ......................... | B62D 6/10 180/402 |
| 2005/0171667 A1 * | 8/2005 | Morita | .................... | B62D 5/049 701/43 |
| 2008/0066994 A1 * | 3/2008 | Fujita | .................... | B62D 5/0463 180/446 |
| 2008/0208407 A1 * | 8/2008 | Tanaka | ................. | B62D 5/0463 701/41 |
| 2008/0243339 A1 * | 10/2008 | Nishimori | .............. | B60G 7/003 701/41 |
| 2010/0299027 A1 * | 11/2010 | Aoki | ..................... | B62D 5/0463 701/42 |
| 2011/0080160 A1 * | 4/2011 | Tomita | ............... | B62D 15/0245 324/76.77 |
| 2012/0006612 A1 * | 1/2012 | Wilson-Jones | ....... | B62D 5/0469 180/446 |
| 2013/0289826 A1 * | 10/2013 | Yoshitake | ............. | B62D 15/021 701/42 |
| 2013/0289827 A1 | 10/2013 | Yoshitake et al. | | |
| 2014/0005894 A1 * | 1/2014 | Aoki | ...................... | B62D 6/001 701/43 |
| 2014/0229062 A1 * | 8/2014 | Kimura | .................... | B62D 6/10 701/41 |
| 2016/0200353 A1 * | 7/2016 | Sasaki | .................... | B62D 5/049 701/43 |
| 2016/0223363 A1 | 8/2016 | Fujita et al. | | |
| 2016/0229445 A1 | 8/2016 | Sasaki et al. | | |
| 2016/0245677 A1 | 8/2016 | Cosgrave et al. | | |
| 2017/0369094 A1 * | 12/2017 | Ukai | ..................... | H02P 29/032 |

FOREIGN PATENT DOCUMENTS

| | | |
|---|---|---|
| JP | 2004-338657 A | 12/2004 |
| JP | 2009-098028 A | 5/2009 |
| JP | 2013-226944 A | 11/2013 |
| JP | 2015-058911 A | 3/2015 |
| JP | 2015-098223 A | 5/2015 |
| JP | 2016-091198 A | 5/2016 |
| JP | 2016-145813 A | 8/2016 |
| WO | WO-2014/148087 A1 | 9/2014 |

OTHER PUBLICATIONS

Office Action issued in corresponding Japanese Application No. 2018-540617 dated Sep. 8, 2020 with English translation.

\* cited by examiner

SENSOR DEVICE

TECHNICAL FIELD

The present invention relates to a sensor device that detects a predetermined state quantity of a driving condition of a vehicle.

BACKGROUND TECHNOLOGY

As a conventional sensor device, for example, one described in the following patent document 1 has been known.

This sensor device is one to be applied to a power steering device, and is provided with a torque sensor for detecting steering torque that is one of state quantities in a driving condition of a vehicle, and with a control device to which signals of the steering torque detected by the torque sensor are input.

The torque sensor includes first and second detecting units that detect the steering torque, and respectively output first and second steering torque signals that are the signals of the steering torque to the control device. The control device is configured to determine whether the first steering torque signal or the second steering torque signal is abnormal by comparing the first steering torque signal with the second steering torque signal.

PRIOR ART REFERENCE

Patent Document

Patent Document 1: Japanese Patent Application Publication 2015-058911

SUMMARY OF THE INVENTION

Problem to be Solved by the Invention

However, by an abnormality determining method of the first and second steering torque signals by the above-mentions comparison, it is not possible to determine which steering torque signals are abnormal. Therefore, when abnormality occurs, it is necessary to take measures, such as turning-off of a sensor function, in view of safety.

Therefore, in recent years, a quadruple-system sensor device provided with four detecting units has been proposed. In this sensor device, for example, even if abnormality is found between the first and second steering torque signals based on the comparison of the first and second steering torque signals, when the comparison result of the third and fourth steering torque signals respectively output by the third and fourth detecting units is normal, a sensor function can be maintained, based on these third and fourth steering torque signals.

Here, to supply power to each of the detecting units of the quadruple-system sensor device, two methods can be considered, such as operation of all of the detecting units by power supplied from one power supply circuit provided to the control device and performing of power supply to the first and second detecting units used for abnormality determination from a first power supply circuit and to the third and fourth detecting units from a second power supply circuit.

However, in the former method, when abnormality occurs in the power supply circuit, all of the detecting units are affected by this abnormality, and the abnormality determination between the first and second detecting units and the abnormality determination between the third and fourth detecting units cannot be correctly performed.

In addition, also in the latter method, for example, when abnormality occurs in the first power supply circuit, the first and second determining units are affected by the abnormality of the first power supply circuit, and the abnormality determination between the first and second detecting units cannot be correctly performed.

The present invention is one developed in view of such a technical problem. An object of the present invention is to provide a sensor device with which the abnormality determination of an output signal can be continued even if abnormality occurs in one of the first and second power supply circuits.

Means for Solving Problem

The present invention, as one aspect thereof, is a sensor device for detecting a predetermined state quantity in a driving condition of a vehicle, including: a first detecting unit for detecting a predetermined state quantity in a driving state of a vehicle; a second detecting unit for detecting the predetermined state quantity; a third detecting unit for detecting the predetermined state quantity; a fourth detecting unit for detecting the predetermined state quantity; a first power supply circuit for supplying power to the first detecting unit and the second detecting unit; a second power supply circuit for supplying power to the third detecting unit and the fourth detecting unit; and a control device including: a first abnormality determining unit for determining whether an output signal of the first detecting unit or an output signal of the fourth detecting unit is abnormal by comparing the output signal of the first detecting unit with the output signal of the fourth detecting unit; and a second abnormality detecting unit for determining whether an output signal of the second determining unit or an output signal of the third determining unit is abnormal by comparing the output signal of the second detecting unit with the output signal of the third detecting unit.

Effect of the Invention

According to the present invention, even when abnormality occurs in one of the first and second power supply circuits, abnormality determination of an output signal can be continued.

MODE FOR IMPLEMENTING THE INVENTION

In the following, each embodiment of a sensor device according to the present invention will be explained with reference to the drawings. In addition, each of the following embodiments is one in which the sensor device is applied to a power steering device that is a steering device of a vehicle.

First Embodiment

Figure 1:
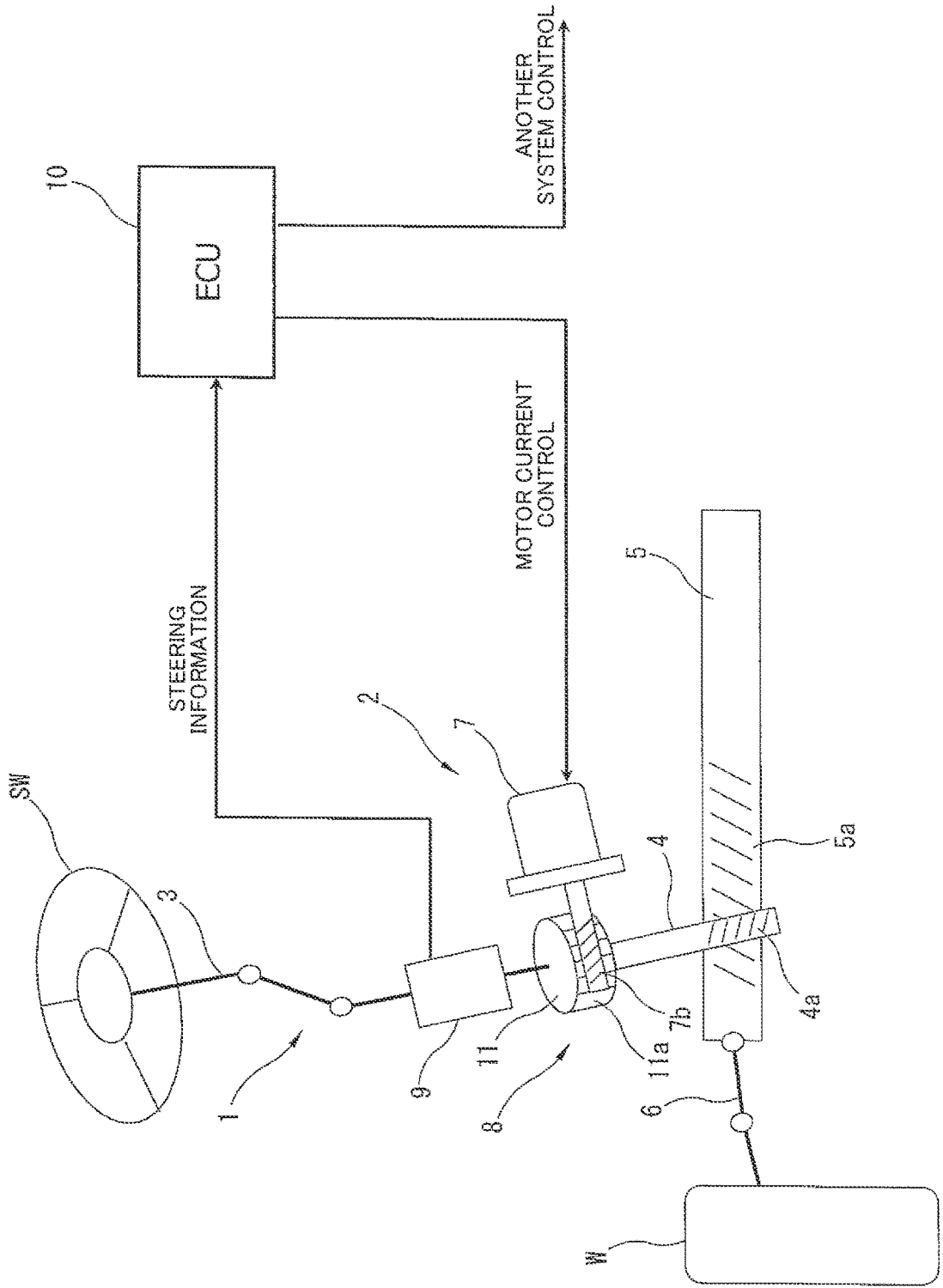
FIG. 1 is a schematic diagram of a power steering device to which a sensor device according to a first embodiment of the present invention is applied.

FIG. 1 is a schematic diagram of a power steering device to which a sensor device according to a first embodiment of the present invention is applied.

The power steering device according to the present embodiment is provided with a steering mechanism 1 for turning a turning wheel W with steering operation of a steering wheel SW, and with a steering assist mechanism 2 for imparting a steering assist force to the steering mechanism 1 in accordance with driving information and the like.

The steering mechanism 1 is provided with a steering shaft 3 including one end portion integrally rotatably connected to the steering wheel SW, a pinion shaft 4 including one end portion connected to the other end portion of the steering shaft 3 through a torsion bar which is not shown in the drawings, and with a rack shaft 5 formed with, on the outer periphery thereof, a rack tooth 5a mesh with a pinion tooth 4a formed on the outer periphery of the pinion shaft 4 and connected with, at the shaft end portion thereof, the turning wheel W through a tie rod 6 and the like.

According to this configuration, when a rotation force is input to the steering wheel SW, the steering mechanism 1 converts it to a linear kinetic force in the axial direction of the rack shaft 5 by a rack and pinion mechanism formed of the pinion shaft 4 and the rack shaft 5.

After that, the converted force is transmitted from the rack shaft 5 to the turning wheel W through the tie rod 6 and the like, and the turning wheel W is turned in the right and left directions The steering assist mechanism 2 is provided with an electric motor 7 for generating an steering assist force, a transmission mechanism 8 for transmitting the steering assist force generated by the electric motor 7 to the pinion shaft 4, a steering sensor 9 that detects the information of a steering operation (steering information) which is input to the steering wheel SW, and with a control device 10 for controlling driving of the electric motor 7 based on the steering information detected by the steering sensor 9 and also for controlling each system.

In addition, the sensor device of the present invention is configured of the steering sensor 9 and the control device 10.

The electric motor 7 is a so-called three-phase motor, and a motor shaft 7a of the electric motor 7 is rotatably driven based on a three-phase AC current sent from the control device 10.

The transmission mechanism 8 is provided with the motor shaft 7a as a worm shaft formed with a tooth portion 7b formed on the outer periphery of the distal end portion thereof and that is a well-known worm gear mechanism, and with a worm wheel 11 that is integrally rotatably fixed to the pinion shaft 4 and includes a tooth portion 11a formed on the outer periphery thereof that meshes with the tooth portion 7b of the motor shaft 7a.

Figure 2:
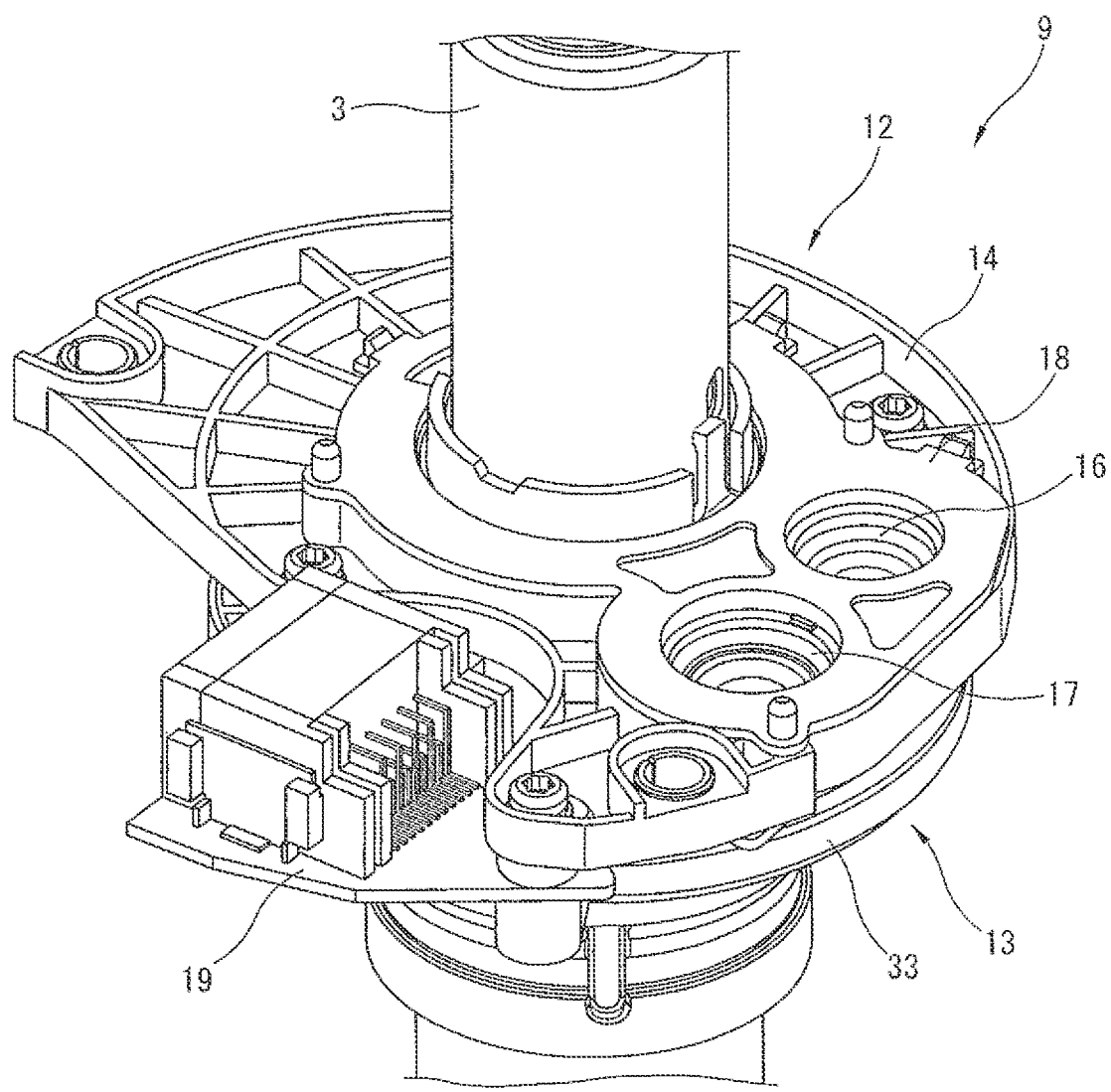
FIG. 2 is a perspective view of a steering sensor according to the first embodiment.
Figure 3:
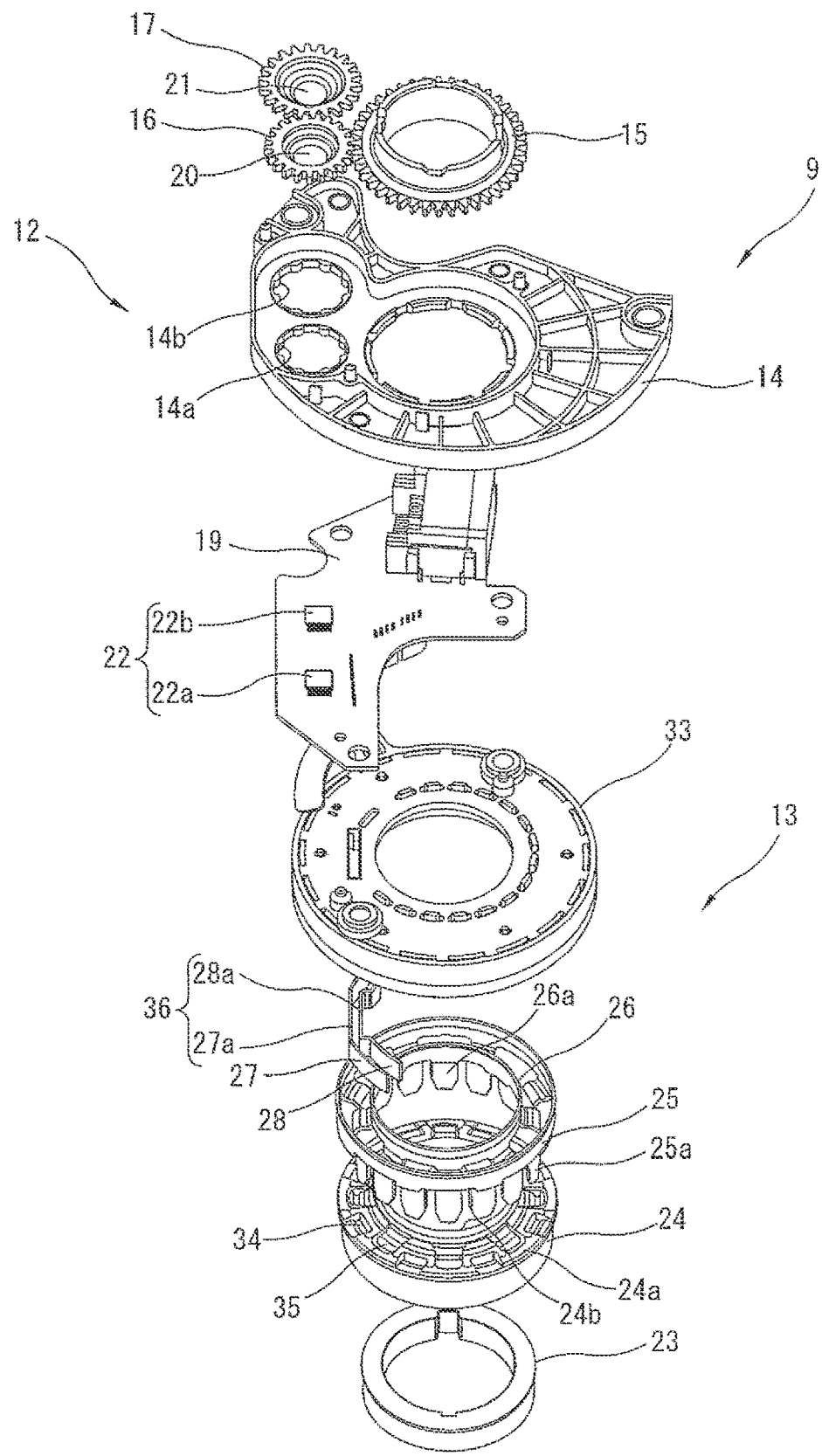
FIG. 3 is an exploded perspective view of the steering sensor.

FIG. 2 is a perspective view showing the steering sensor 9, and FIG. 3 is an exploded perspective view of the steering sensor 9.

The steering sensor 9 is provided with a steering angle sensor 12 for detecting the steering angle of the steering wheel SW that is one of state quantities in a driving condition of a vehicle, and with a torque sensor 13 for detecting steering torque input to the steering wheel SW as a state quantity other than the steering angle.

The steering angle sensor 12 is disposed more on the steering wheel SW side than the torque sensor 13 in a sensor housing which is not shown in the drawings. In addition, the steering angle sensor 12 is mainly formed of a casing 14, a main gear 15 integrally rotatably connected to the outer periphery of the steering shaft 3, a first detection gear 16 provided so as to mesh with the main gear 15, a second detection gear 17 provided so as to mesh with the first detection gear 16, that are three gears accommodated in the casing 14, a cover member 18 having a plate shape for suppressing falling of the three gears 15 to 17 accommodated in the casing 14, and a board 19 for a sensor which is disposed on a lower side of the casing 14 (torque sensor 13 side).

Each of the three gears 15 to 17 is integrally made of synthetic resin so as to reduce weight, meshing noise and the like. In addition, the gears 15 to 17 are formed so as to different number of teeth from each other. In particular, the number of the teeth of the first detection gear 16 and the number of the teeth of the second detection gear 17 are set so as to be indivisible by each other.

Specifically, the number of the teeth of the first detection gear 16 is set to be 20 teeth. On the other hand, the number of the teeth of the second gear 17 is set to be 22 teeth. With this, only one set of the combination of the rotation angle of the first detection gear 16 and the rotation angle of the second detection gear 17 with respect to a predetermined rotation angle of the main gear 15 (predetermined wheel angle of the steering wheel SW) exists. In other words, if the rotation angles of the first detection gear 16 and the second detection gear 17 are only known, the wheel angle of the steering wheel SW can be calculated by those rotation angles.

Moreover, in order to detect the rotation angle of the first detection gear 16 and the rotation angle of the second detection gear 17, permanent magnets 20 and 21 are respectively attached to the detection gears 16 and 17. In addition, at least a pair of MR elements 22a and 22b (magnetic resistance elements) that respectively detects magnetic fields generated by the permanent magnets 20 and 21 through first and second holes 14a and 14b formed so as to penetrate the bottom of the casing 14 is provided to parts facing the detection gears 16 and 17 of the sensor board 19 respectively.

The steering angle sensor 12 detects the rotation angles of the first and second gears 16 and 17 based on the magnetic fields detected by the MR elements 22a and 22b, and calculates the steering angle of the steering wheel SW by the combination of the detected two rotation angles.

That is, one steering angle detection section 22 is formed of a pair of the MR elements 22a and 22b, and the steering angle sensor 12 is configured to detect the steering angle of the steering wheel SW by this steering angle detection section 22.

The torque sensor 13 is provided with: an annular magnetic member 23 which is integrally rotatably provided to the pinion shaft 4 and in which magnetic poles different from each other are alternately disposed along the circumferential direction of the pinion shaft 4; a holder member 24 integrally rotatably fixed to the steering shaft 3 and accommodating the magnetic member 23 inside thereof; a pair of first and second yokes 25 and 26 formed in a cylindrical shape and made of soft magnetic material, connected to the steering shaft 3 through the holder member 24, and provided such that the one end sides of the first and second yokes 25 and 25 radially face the magnetic member 23; a pair of first and second magnetism collecting plates 27 and 28 as members to be detected which is accommodated between the first and second yokes 25 and 26 on the other end sides of the yokes 25 and 26 and which collects the magnetic flux of the magnetic member 23 to a predetermined area, which leaks toward the other end sides of the yokes 25 and 26; first to fourth Hall elements 29 to 32 (see FIG. 4) for detecting the magnetic flux flowing through the part between these magnetism collecting plates 27 and 28; a cylindrical casing 33 having a lid for accommodating, inside thereof, the other end sides of the yokes 25 and 26, the magnetism collecting plates 27 and 28 and the after-mentioned Hall element main bodies 29a, 30a, 31a and 32a respectively provided to first to fourth Hall elements 29 to 32; and the sensor board 19 electrically connected to the first to fourth Hall elements 29 to 32.

That is, the steering angle sensor 12 and the torque sensor 13 share the sensor board 19 with each other.

The holder member 24 is made of non-magnetic synthetic resin, and formed in a cylindrical shape with a lid which opens toward the side opposite to the steering angle sensor 12. In addition, an insertion hole 24b into which the steering shaft 3 is inserted is formed in the middle position of a lid portion 24a, and a plurality of first and second claw portion insertion holes 34 and 35 are alternately formed and disposed on the outer circumferential side of the lid portion 24a along the circumferential direction of the steering shaft 3.

The first yoke 25 is formed in a crank shape in cross section such that one end side thereof has a relatively small diameter and the other end side has a relatively large diameter, and has, at the one end side thereof, a plurality of first claw portions 25a extending in the axial direction of the steering shaft 3. In addition, the first claw portions 25a are inserted into the respective first claw portion insertion holes 34 of the holder member 24, and the first yoke 25 is indirectly connected to the steering shaft 3 in a state in which each of the first claw portions 25a radially faces the magnetic member 23.

The second yoke 26 is formed in a crank shape in cross section such that one end side thereof has a relatively small diameter and the other end side has a relatively large diameter, and has, at the one end side thereof, a plurality of second claw portions 26a extending in the axial direction of the steering shaft 3. In addition, the second claw portions 26a are inserted into the respective second claw portion insertion holes 35 of the holder member 24, and the second yoke 26 is also indirectly connected to the steering shaft 3 in a state in which each of the second claw portions 26a radially faces the magnetic member 23.

Figure 4:
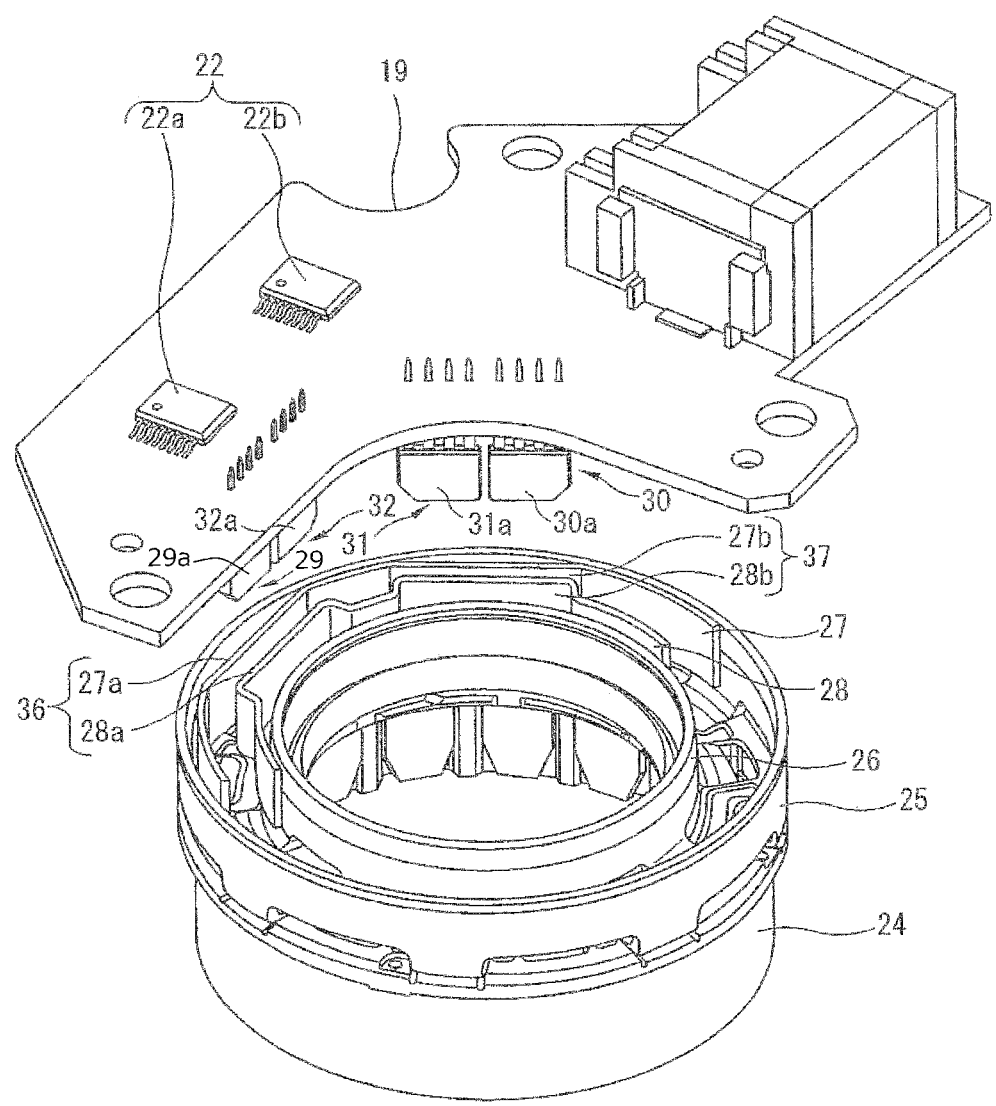
FIG. 4 is a perspective view showing attachment positions of Hall elements

FIG. 4 is a drawing showing the detailed configuration and positional relationship of the first and second magnetism collecting plates 27 and 28 and the Hall elements 29 to 32.

The first and second magnetism collecting plates 27 and 28 are each made of soft magnetic material and formed in a semicircular arc-shape. The first and second magnetism collecting plates 27 and 28 are disposed to face each other in the radial space between the other end portion of the first yoke 25 and the other end portion of the second yoke 26 facing each other such that the first magnetism collecting plate 27 is located on the outer circumferential side and the second magnetism collecting plate 28 is located on the inner circumferential side.

In addition, the first magnetism collecting plate 27 is provided with, at predetermined positions in the circumferential direction thereof, first and second concave portions 27a and 27b recessed radially inward. On the other hand, in the second magnetism collecting plate 28, first and second projection portions 28a and 28b projecting radially outward are provided at the positions facing the first and the second concave portions 27a and 27b respectively.

According to the configuration, a first section 36 to be detected which is formed of the first concave portion 27a and the first projection portion 28a, and a second section 37 to be detected which is formed of the second concave portion 27b and the second projection portion 28b are formed between the first and the second magnetism collecting plates 27 and 28.

The first to fourth Hall elements 29 to 32 are electronic components and are mounted on respective chips. In addition, the first to fourth Hall elements 29 to 32 are provided with the Hall element main bodies 29a, 30a, 31a and 32a respectively and are each provided with four metal terminals for electrically connecting the Hall element main bodies 29a, 30a, 31a and 32a to the sensor board 19.

The each of the Hall elements 29 to 32 is configured to detect steering torque by measuring magnetic flux density of the magnetic field inside the space between the magnetism collecting plates 27 and 28 which increases as the steering torque to be input to the steering wheel SW increases, by using a Hall effect.

More specifically, the first Hall element 29 and the fourth Hall element 32 are disposed inside the first detected section 36 formed between the magnetism collecting plates 27 and 28 which become detection objects, so as to be adjacent to each other, to detect the steering torque in the inside of the common first detected section 36.

In addition, at this time, the first Hall element 29 and the fourth Hall element 32 are provided such that a surface of the Hall element main body 29a faces in the direction opposite to the direction in which a surface of the Hall element main body 32a faces (inside-out state). With this, a first torque signal Tr1 that is the output signal of the first Hall element 29 to the steering torque and a fourth torque signal Tr4 that is the output signal of the fourth Hall element 32 to the steering torque show output characteristics shown in FIG. 5.

That is, the fourth torque signal Tr4 shows a change in a decrease tendency when the first torque signal Tr1 shows a change in an increase tendency, and the fourth torque signal Tr4 shows a change in an increase tendency when the first torque signal Tr1 shows a change in a decrease tendency. With this, when the first and fourth torque signals Tr1 and Tr4 are normal, the sum of the first torque signal Tr1 and the fourth torque signal Tr4 indicates an approximately constant value, regardless of the value of the steering torque.

On the other hand, the second Hall element 30 and the third Hall element 31 are disposed inside the second detected section 37 formed between the magnetism collecting plates 27 and 28 which become detection objects, so as to be adjacent to each other, to detect the steering torque in the inside of the common second detected section 37.

In addition, at this time, the second Hall element 30 and the third Hall element 31 are also provided such that a surface of the Hall element main body 30a faces in the direction opposite to the direction in which a surface of the Hall element main body 31a faces (inside-out state).

Figure 5:
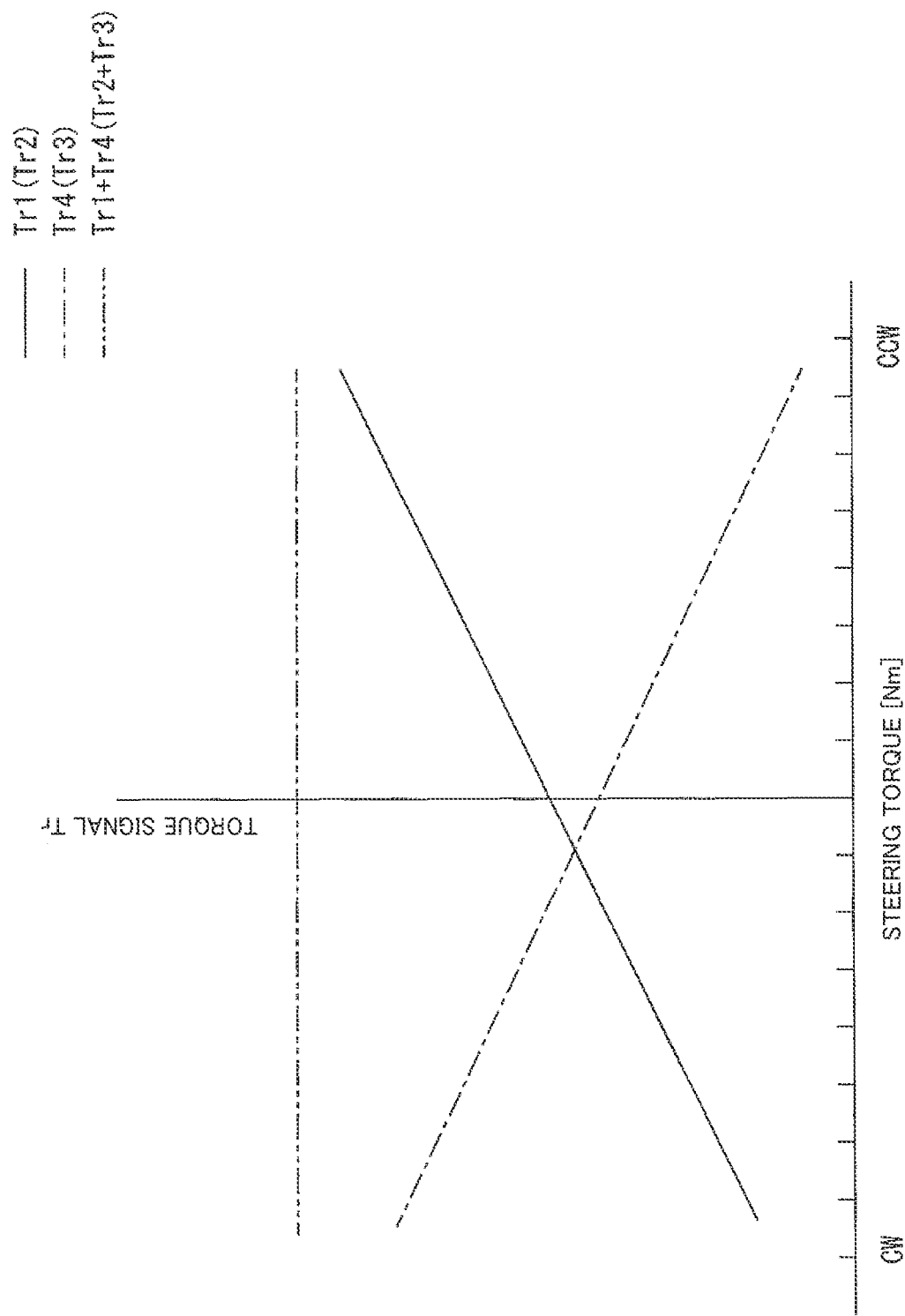
FIG. 5 is a drawing showing output characteristics of a first Hall element and a fourth Hall element and output characteristics of a second Hall element and a third Hall element.

With this, a second torque signal Tr2 that is the output signal of the second Hall element 30 to the steering torque and a third torque signal Tr3 that is the output signal of the third Hall element 31 to the steering torque also show output characteristics shown in FIG. 5.

That is, the third torque signal Tr3 shows a change in a decrease tendency when the second torque signal Tr2 shows a change in an increase tendency, and the third torque signal Tr3 shows a change in an increase tendency when the second torque signal Tr2 shows a change in a decrease tendency. With this, when the second and third torque signals Tr2 and Tr3 are normal, the sum of the second torque signal Tr2 and the third torque signal Tr3 indicates an approximately constant value, regardless of the value of the steering torque.

Figure 6:
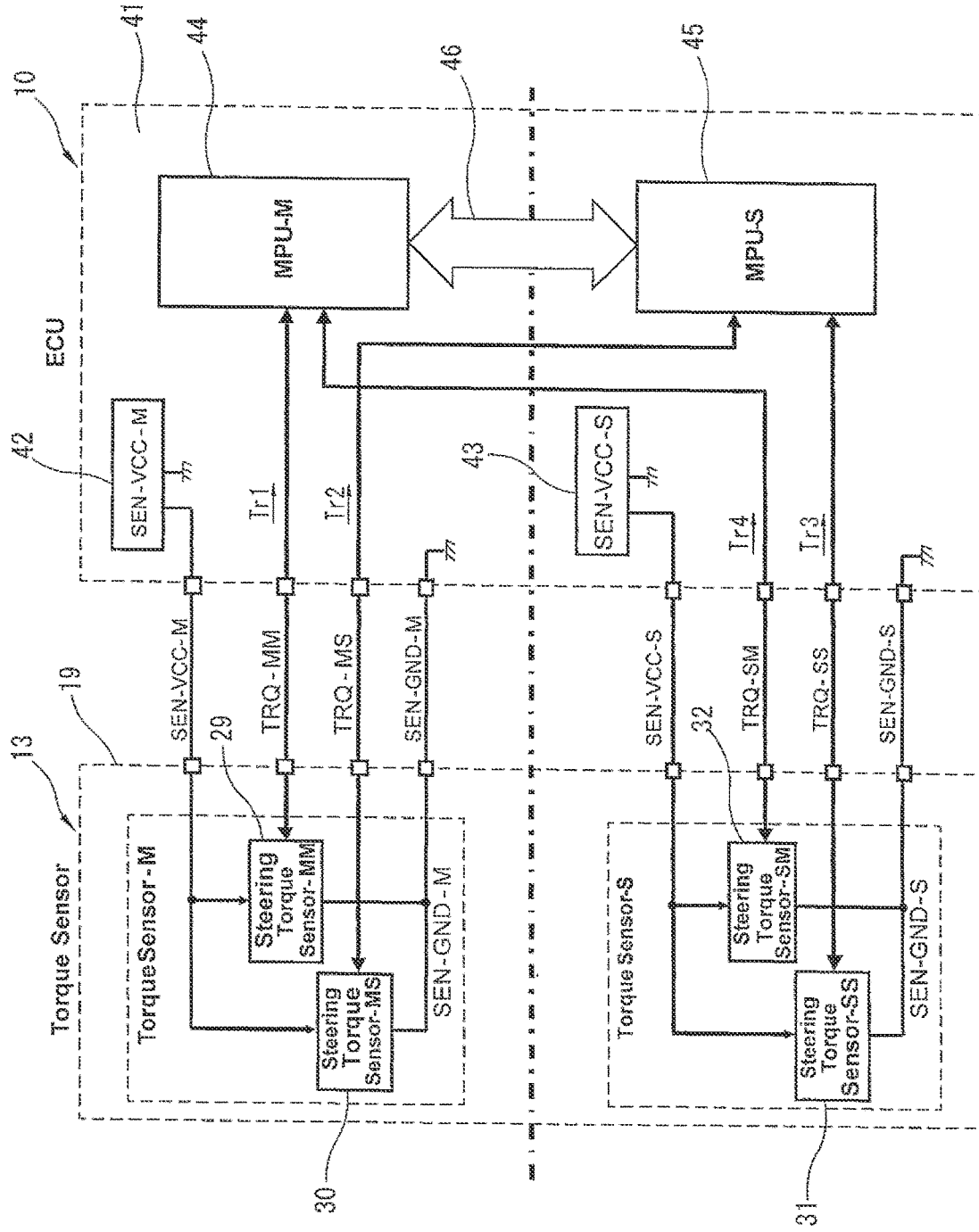
FIG. 6 is a drawing showing a specific configuration of a control device according to the first embodiment and a specific connection relationship between the control device and the steering sensor.

FIG. 6 is a drawing showing a specific configuration of the control device 10 and a specific relationship between the control device 10 and the torque sensor 13.

The control device 10 has a configuration in which a conductor pattern is formed on each of the both sides of a board 41 made of non-conductive resin material and electronic components are mounted onto the conductor pattern.

More specifically, the control device 10 is provided with two first and second power supply circuits 42 and 43 for supplying power to the torque sensor 13 and two first and second processor cores 44 and 45 for performing various arithmetic processing, on a non-divided one board 41.

The first power supply circuit 42 supplies power output from a battery and the like mounted on a vehicle, which is not shown in the drawings, to the first and second Hall elements 29 and 30 through the conductor pattern on the board 41 and a harness, and the conductor pattern on the sensor board 19 and the like.

On the other hand, in the same way as the first power supply circuit 42, the second power supply circuit 43 supplies power output from the battery and the like to the third and fourth Hall elements 31 and 32 through the conductor pattern on the board 41 and a harness, the conductor pattern on the sensor board 19 and the like.

The first processor core 44 is electrically connected to the first and fourth Hall elements 29 and 32 through the conductor pattern on the board 41 and a harness, the conductor pattern on the sensor board 19 and the like.

On the other hand, the second processor core 45 is electrically connected to the second and third Hall elements 30 and 31 through the conductor pattern on the board 41 and a harness, the conductor pattern on the sensor board 19 and the like.

That is, the connection between the first and second processor cores 44 and 45 and the Hall elements 29 to 32 has a crossing (cross) relationship with respect to the connection between the first and second powers supply circuits 42 and 43 and the Hall elements 29 to 32.

In addition, the first processor core 44 and the second processor core 45 are electrically connected to each other through a signal transmitting unit 46, so as to transmit signals between the first and second processor cores 44 and 45 through the signal transmitting unit 46.

In addition, in the present embodiment, although it is shown that the first processor core 44 and the second processor core 45 are provided to respective chips, it is possible to provide these processor cores to one chip. That is, it may be formed of two single cores, or may be formed of one dual core.

Figure 7:
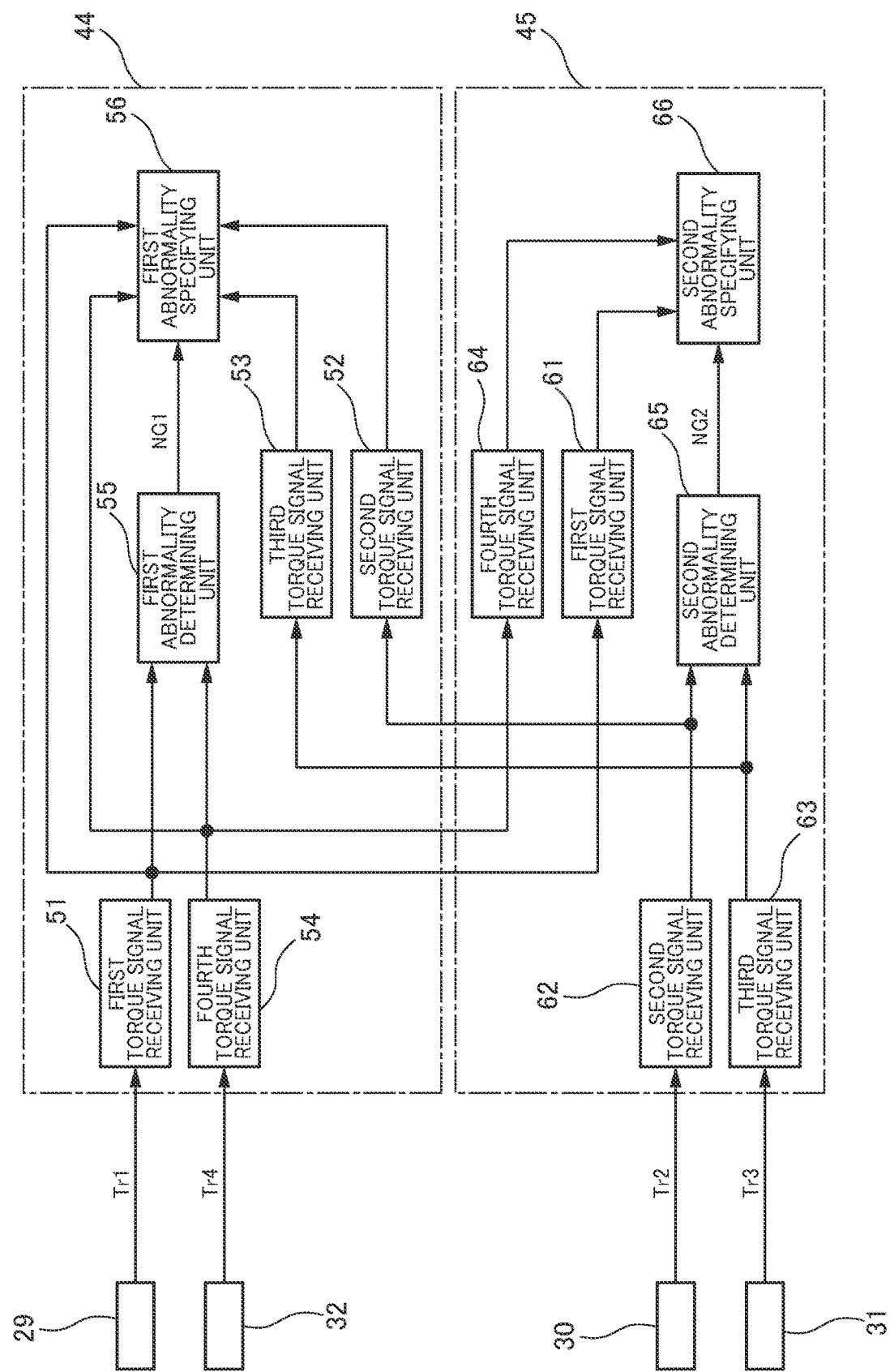
FIG. 7 is a control block diagram showing the contents of control processing by first and second processor cores of the control device.

FIG. 7 is a control block diagram showing the contents of control processing by the first processor core 44 and the second processor core 45 of the control device 10.

The first processor core 44 is provided with first to fourth torque signal receiving units 51 to 54 for respectively receiving the first to fourth torque signals Tr1 to Tr4 respectively output from the first to fourth Hall elements 29 to 32, a first abnormality determining unit 55 for determining abnormality of the first and the fourth torque signals Tr1 and Tr4, and with a first abnormality specifying unit 56 for specifying which signal is abnormal, when the first abnormality determining unit 55 determines that abnormality occurs in the first and fourth torque single Tr1 and Tr4.

The first torque receiving unit 51 directly receives the first torque signal Tr1 from the Hall element 29, and the fourth torque receiving unit 54 directly receives the fourth torque signal Tr4 from the Hall element 32.

On the other hand, the second and third torque signal receiving units 52 and 53 indirectly receive the second and third torque signals Tr2 and Tr3 respectively, which are fetched by the second core processor 45, through the signal transmitting unit 46.

The first abnormality determining unit 55 determines whether the first torque signal Tr1 and the fourth torque signal Tr4 are abnormal or not by comparing the first torque signal Tr1 with the fourth torque signal Tr4.

More specifically, the first abnormality determining unit 55 calculates the sum of the first torque signal Tr1 and the fourth torque signal Tr4, and determines whether this sum is within a predetermined range (T×1≤Tr1+Tr4≤T×2) or not. Then, if the sum of the first torque signal Tr1 and the fourth torque signal Tr4 deviates from the predetermined range, it determines that abnormality occurs in at least one of the first and fourth torque signals Tr1 and Tr4, and outputs an abnormality occurrence signal NG1 to the first abnormality specifying unit 56.

When receiving the abnormality occurrence signal NG1 from the first abnormality determining unit 55, the first abnormality specifying unit 56 fetches the first to fourth torque signals Tr1 to Tr4 from the first to fourth torque signal receiving units 51 to 54. Then, it specifies a torque signal in which abnormality occurs by performing a plurality of patterns of processes, such as a process in which two particular steering torque signals are taken out from the fetched first to fourth torque signals Tr1 to Tr4 and redundant comparison is performed.

Here, when only one torque signal is specified to be abnormal by the first abnormality specifying unit 56, after that, the control device 10 makes majority decision among three torque signals except the abnormal torque signal, and continues the abnormality determination.

On the other hand, when it is specified that two or more torque signals are abnormal by the first abnormality specifying unit 56, the control device 10 switches the control processing of the electric motor 7 based on the steering sensor 9 from normal processing to fail-safe processing such as limp-home (temporarily remaining of steering assistant) processing and half-assist (reduction of an steering assist force) processing.

The second processor core 45 is provided with a first to fourth torque signal receiving units 61 to 64 for respectively receiving the first to fourth torque signals Tr1 to Tr4 respectively output from the first to fourth Hall elements 29 to 32, a second abnormality determining unit 65 for determining abnormality of the second torque signal Tr2 and the third torque signal Tr3, and with a second abnormality specifying unit 66 for specifying which signal is abnormal, when the second abnormality determining unit 65 determines that abnormality occurs in the second torque signal Tr2 and the third torque signal Tr3.

The second torque receiving unit 62 directly receives the second torque signal Tr2 from the Hall element 30, and the third torque receiving unit 63 directly receives the third torque signal Tr3 from the Hall element 31.

On the other hand, the first and fourth torque signal receiving units 61 and 64 indirectly receive the first and fourth torque signals Tr1 and Tr4 respectively, which are fetched by the second core processor 45, through the signal transmitting unit 46.

The second abnormality determining unit 65 determines whether the second torque signal Tr2 and the third torque signal Tr3 are abnormal or not by comparing the second torque signal Tr2 with the third torque signal Tr3.

More specifically, the second abnormality determining unit 65 calculates the sum of the second torque signal Tr2 and the third torque signal Tr3, and determines whether this sum is within a predetermined range ($T \times 1 \leq Tr2+Tr3 \leq T \times 2$) or not. Then, if the sum of the second torque signal Tr2 and the third torque signal Tr3 deviates from the predetermined range, it determines that abnormality occurs in at least one of the second and third torque signals Tr2 and Tr3, and outputs an abnormality occurrence signal NG2 to the second abnormality specifying unit 66.

When receiving the abnormality occurrence signal NG2 from the second abnormality determining unit 65, the second abnormality specifying unit 66 fetches the first to fourth torque signals Tr1 to Tr4 from the first to fourth torque signal receiving units 61 to 64. Then, it specifies a torque signal in which abnormality occurs by performing a plurality of patterns of processes, such as a process in which two particular steering torque signals are taken out from the fetched first to fourth torque signals Tr1 to Tr4 and redundant comparison is performed.

Here, when only one torque signal is specified to be abnormal by the second abnormality specifying unit 66, after that, the control device 10 makes majority decision among three torque signals except the abnormal torque signal, and continues the abnormality determination.

On the other hand, when it is specified that two or more torque signals are abnormal by the second abnormality specifying unit 66, the control device 10 switches the control processing of the electric motor 7 based on the steering sensor 9 from normal processing to fail-safe processing such as limp-home (temporarily remaining of steering assistant) processing and half-assist (reduction of an steering assist force) processing.

In addition, as mentioned above, although the first and second abnormality determining units 55 and 65 are ones for determining whether the first to fourth torque signals Tr1 to Tr4 are abnormal, the cause of this abnormality is not only abnormality of the torque signals Tr1 to Tr4 themselves, but abnormality of torque signals Tr1 to Tr4 associated with abnormality of the first to fourth Hall elements 29 to 32 and abnormality of the torque signals Tr1 to Tr4 associated with abnormality of the first and second power supply circuits 42 and 43 are also included.

Figure 8:
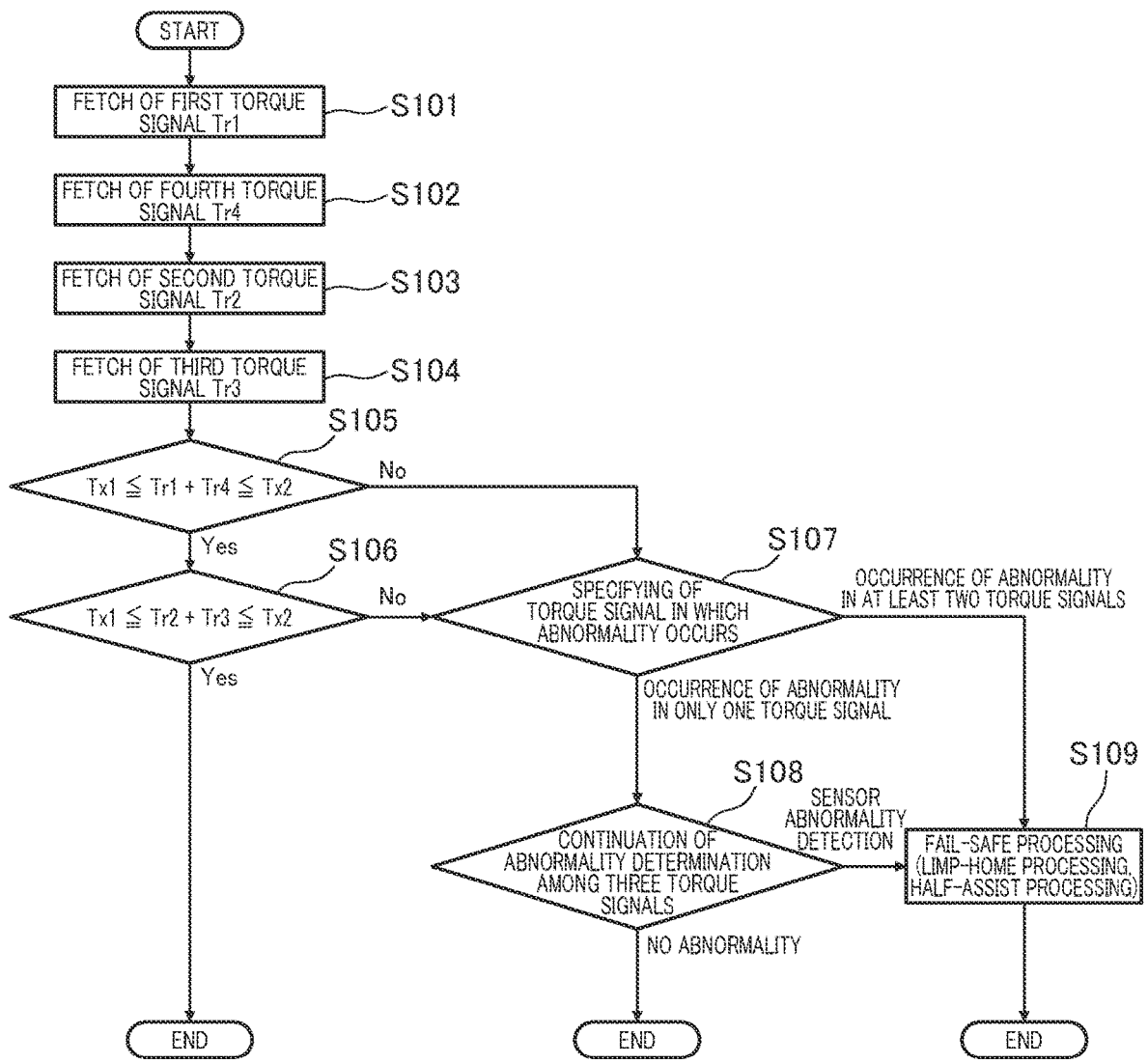
FIG. 8 is a flow chart showing fail-safe processing based on abnormality determination processing and abnormality determination of first to fourth torque signals by the control device.

FIG. 8 is a flow chart showing fail-safe processing based on the abnormality determination processing and the abnormality determination of the first to fourth torque signals Tr1 to Tr4 by the control device 10.

That is, in the present flow, first, the first and fourth torque signals Tr1 and Tr4 are respectively fetched to the first and fourth torque signal receiving units 51 and 54 of the first processor core 44 (steps S101, S102). After that, the second and third torque signals Tr2 and Tr3 are respectively fetched to the second and third torque receiving units 62 and 63 of the second processor core 45 (steps S103, S104).

Next, in the present flow, the first abnormality determining unit 55 determines whether the sum of the first and fourth torque signals Tr1 and Tr4 is within the predetermined range ($T \times 1 \leq Tr1+Tr4 \leq T \times 2$) or not (step S105). Here, when the determination is "YES", in a next step S106, the second abnormality determining unit 65 determines whether the sum of the second and third torque signals Tr2 and Tr3 is within the predetermined range ($T \times 1 \leq Tr2+Tr3 \leq T \times 2$) or not.

When the determination is also "YES" in this step, it is determined that the first to fourth torque signals Tr1 to Tr4 are normal, and a state in which normal steering assist processing by the control device 10 is performed is maintained, and then the present program is ended.

On the other hand, when the determination is "No" in the step S105 or the step S106, in the next step S107, a torque signal in which abnormality occurs is specified by the first and second abnormality specifying units 56 and 66.

Here, when it is determined that abnormality occurs in only one torque signal in this step, by majority decision among remaining three torque signals, the abnormality determination is continued (step S108).

When abnormality does not occur in the remaining three torque signals, a state in which the normal steering assist processing by the control device 10 is performed is maintained, and then the present program is ended. On the other hand, when the remaining three torque signals are abnormal, in a step S109, the steering assist processing by the control device 10 is switched from normal processing to fail-safe processing such as limp-home processing and half-assist processing, and then the present program is ended.

In addition, when it is determined that two or more torque signals are abnormal in a step S107, the process directly proceeds to the step S109, and then the present program is ended.

Working Effect of Present Embodiment

In the sensor device of the present embodiment, power is supplied from the first power supply circuit 42 to the first Hall element 29 and the second Hall element 30, and power is supplied from the second power supply circuit 43 to the third Hall element 31 and the fourth Hall element 32.

In addition, on the other hand, the abnormality determination by the first abnormality determining unit 55 is performed to the first and fourth torque signals Tr1 and Tr4 respectively output from the first and fourth Hall elements 29 and 32, and the abnormality determination by the second abnormality determining unit 65 is performed to the second and third torque signals Tr2 and Tr3 respectively output from the second and third Hall elements 30 and 31.

With this, for example, even when abnormality occurs to the first power supply circuit 42, and, with this, abnormality occurs in the first and second torque Tr1 and Tr2, if the second power supply circuit 43 is normal, since the remaining third and fourth torque Tr3 and Tr4 show normal values, the abnormality determination to each of the torque signals Tr1 to Tr4 by the first and second abnormality determining units 55 and 65 can be therefore continued.

In addition, in the present embodiment, since the first and second abnormality determining units 55 and 65 are provided to the first and second processor cores 44 and 45 respectively, even if abnormality occurs in one of the processor cores, a function of the other processor core remains. Consequently, reliability of the sensor device can be improved.

Moreover, in the present embodiment, by the signal transmitting unit 46, the signal transmission between the first processor core 44 and the second processor core 45 becomes possible, and the first and second abnormality specifying units 56 and 66 are provided to the both processor cores 44 and 45 respectively.

With this, when abnormality occurs in one of the first to fourth torque signals Tr1 to Tr4, it is possible to specify only this torque signal in which abnormality occurs.

In the present embodiment, although the first and second abnormality specifying units 56 and 66 are provided to the both processor cores 44 and 45 respectively, the abnormality specifying units may be provided to only one of the processor cores.

In addition, the specifying of an abnormal torque signal by the first and second abnormality specifying units 56 and 66 can be performed as long as at least three torque signals are input. Consequently, for example, even if the present embodiment has a configuration in which the third torque signal receiving unit 53 is eliminated from the first processor core 44 and the first torque signal receiving unit 61 is eliminated from the second processor core 45, similarly, the specifying of a torque signal in which abnormality occurs can be possible.

Moreover, in the present embodiment, since the first and second power supply circuits 42 and 43 and the first and second processor cores 44 and 45 are mounted onto the same undivided board 41, the formation of a conductor pattern (wiring) becomes easy.

Furthermore, in the present embodiment, the fourth Hall element 32 is provided such that the fourth torque signal Tr4 shows a change in a decrease tendency when the first torque signal Tr1 output from the first Hall signal 29 shows a change in an increase tendency, and the fourth torque signal Tr4 shows a change in an increase tendency when the first torque signal Tr1 shows a change in a decrease tendency.

Therefore, when the first and fourth torque signals Tr1 and Tr4 are normal, the sum of the first and fourth torque signals Tr1 and Tr4 is always included within a predetermined range, regardless of the value of the steering torque. Consequently, in the first abnormality determining unit 55, the abnormality determination of the first and fourth torque signals Tr1 and Tr4 can be performed, based on one reference whether the sum of the first and fourth torque signals Tr1 and Tr4 is within a predetermined range (($T \times 1 \leq Tr1 + Tr4 \leq T \times 2$) or not, regardless of the value of the steering torque.

That is, since it becomes unnecessary to store values within a plurality of predetermined ranges in accordance with the steering torque, the abnormality determination to the first and fourth torque signals Tr1 and T4 can be performed with simple arithmetic processing.

In addition, since the third Hall element 31 is provided such that the third torque signal Tr3 shows a change in a decrease tendency when the second torque signal Tr2 output from the second Hall signal 30 shows a change in an increase tendency, and the third torque signal Tr3 shows a change in an increase tendency when the second torque signal Tr2 shows a change in a decrease tendency, the same working effect as the above working effect can be also obtained in the second abnormality determining unit 65.

Moreover, in the present embodiment, although the abnormality determination of the first and fourth torque signals Tr1 and Tr4 (second and third torque signals Tr2 and Tr3) is determined based on the sum of the two torque signals, a method of the abnormality determination is not limited to this.

That is, the abnormality determination can be also performed by using another arithmetic method in which the abnormality determination is performed based on the difference between the two torque signals.

Moreover, in the present embodiment, the first and fourth Hall elements 29 and 32 are disposed so as to be adjacent to each other, to detect the steering torque in the inside of the first detected section 36. In addition, the second and third Hall elements 30 and 31 are also disposed so as to be adjacent to each other, to detect the steering torque in the inside of the second detected section 37.

With this, the detection error between the first torque signal Tr1 output from the first Hall element 29 and the fourth torque signal Tr4 output from the fourth Hall element 32, and the detection error between the second torque signal Tr2 output from the second Hall element 30 and the third torque signal Tr3 output from the third Hall element 31 can be suppressed.

In addition, in the present embodiment, although it has been explained that the first and fourth Hall elements 29 and 32 disposed adjacent to each other are mounted onto respective chips, they can be mounted onto a common chip.

In this case, since a plurality of the first and fourth Hall elements 29 and 32 can be arranged to one chip, layout property of the first and fourth Hall elements 29 and 32 in the sensor device can be improved. In the same way as those Hall elements, the second and third Hall elements 30 and 31 disposed adjacent to each other can be also mounted onto a common chip, and layout property of the second and third Hall elements 30 and 31 in the sensor device can be improved.

Second Embodiment

Figure 9:
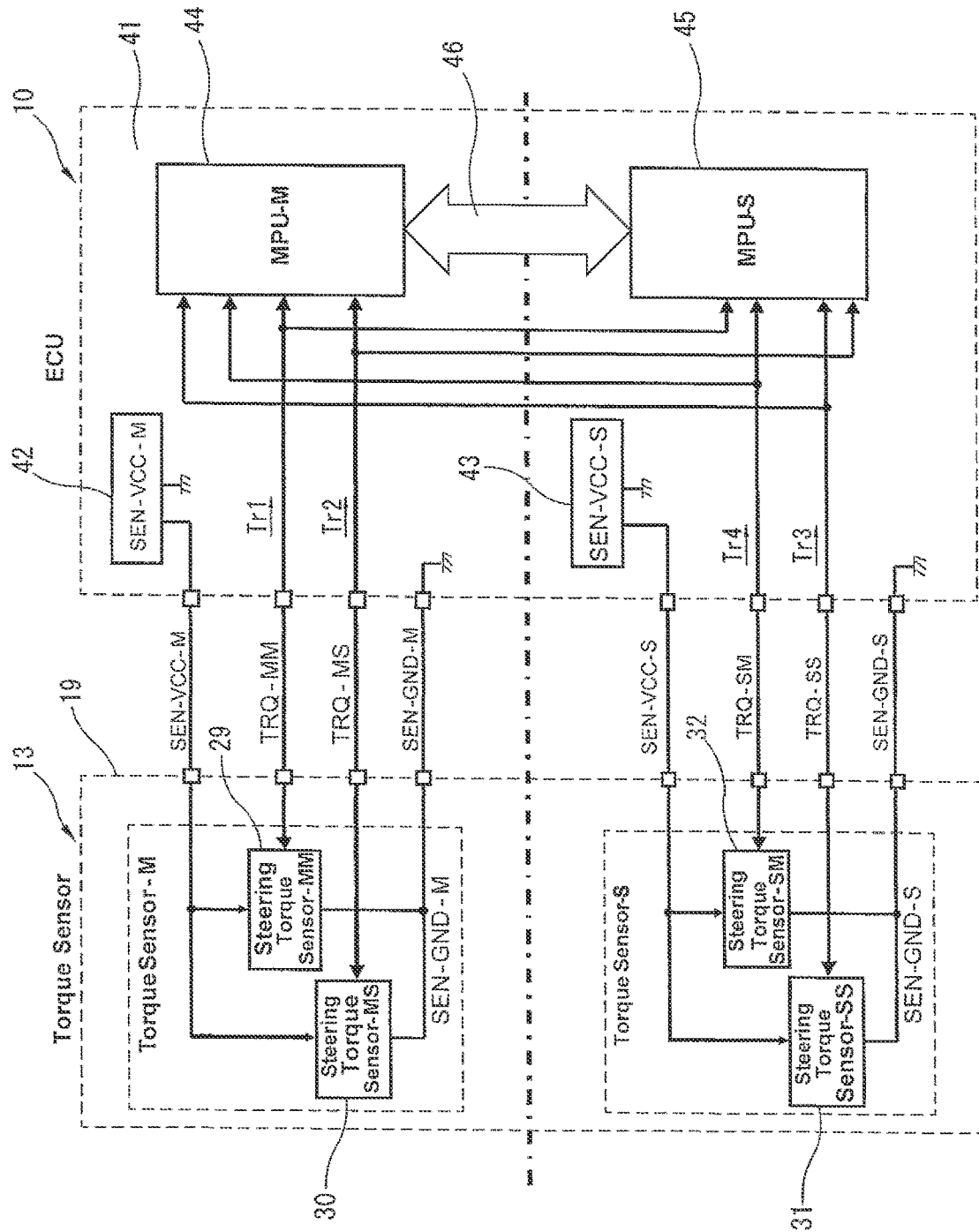
FIG. 9 is a drawing showing a specific configuration of a control device according to a second embodiment and a specific connection relationship between the control device and the torque sensor.

In a second embodiment of the present invention shown in FIG. 9, although the basic configuration of the second embodiment is the same as that of the first embodiment, the connection relationship between the first to fourth Hall element 29 to 32 and the first and second processor cores 44 and 45 is changed. In addition, in the present embodiment, the same symbols are applied to the same components as those of the first embodiment, and specific explanation is omitted.

That is, the first to fourth Hall elements 29 to 32 according to the present embodiment are electrically connected to the both first and second processor cores 44 and 45. With this, the first to fourth torque signals Tr1 to Tr4 respectively output from the first to fourth Hall elements 29 to 32 are directly sent to each of the both first and second processor cores 44 and 45.

According to the configuration, based on the first to fourth torque signals Tr1 to Tr4 directly acquired from the first to fourth Hall elements 29 to 32, each of the first and second processor cores 44 and 45 can perform specifying of an abnormal torque signal by a corresponding one of the first and second abnormality determining units 56 and 66. Therefore, the specifying of the abnormal torque signal can be performed without relying on the communication through the signal transmitting unit 46 with communication delay.

In addition, another working effect is substantially the same as that of the first embodiment.

Third Embodiment

Figure 10:
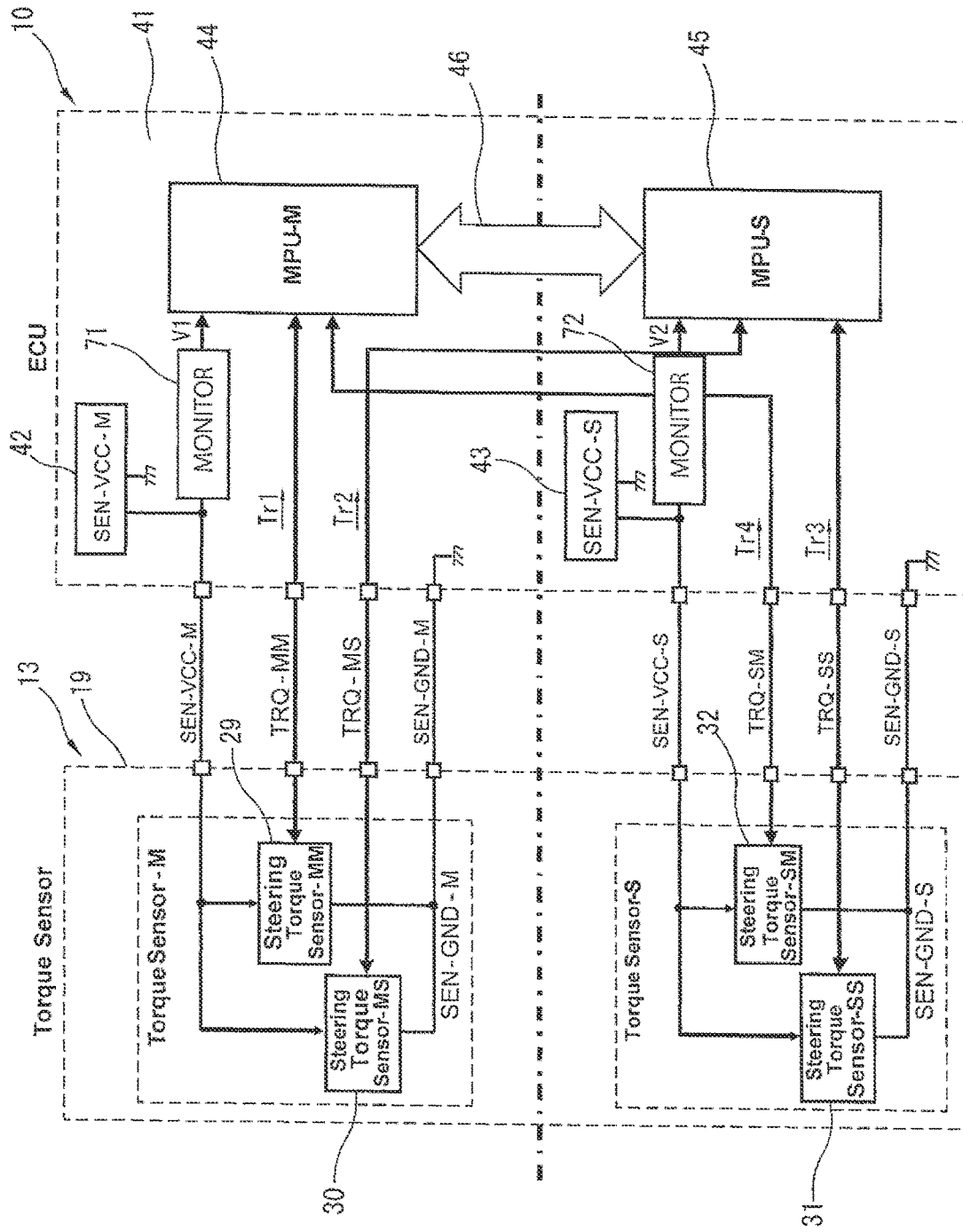
FIG. 10 is a drawing showing a specific configuration of a control device according to a third embodiment and a specific connection relationship between the control device and the torque sensor.
Figure 11:
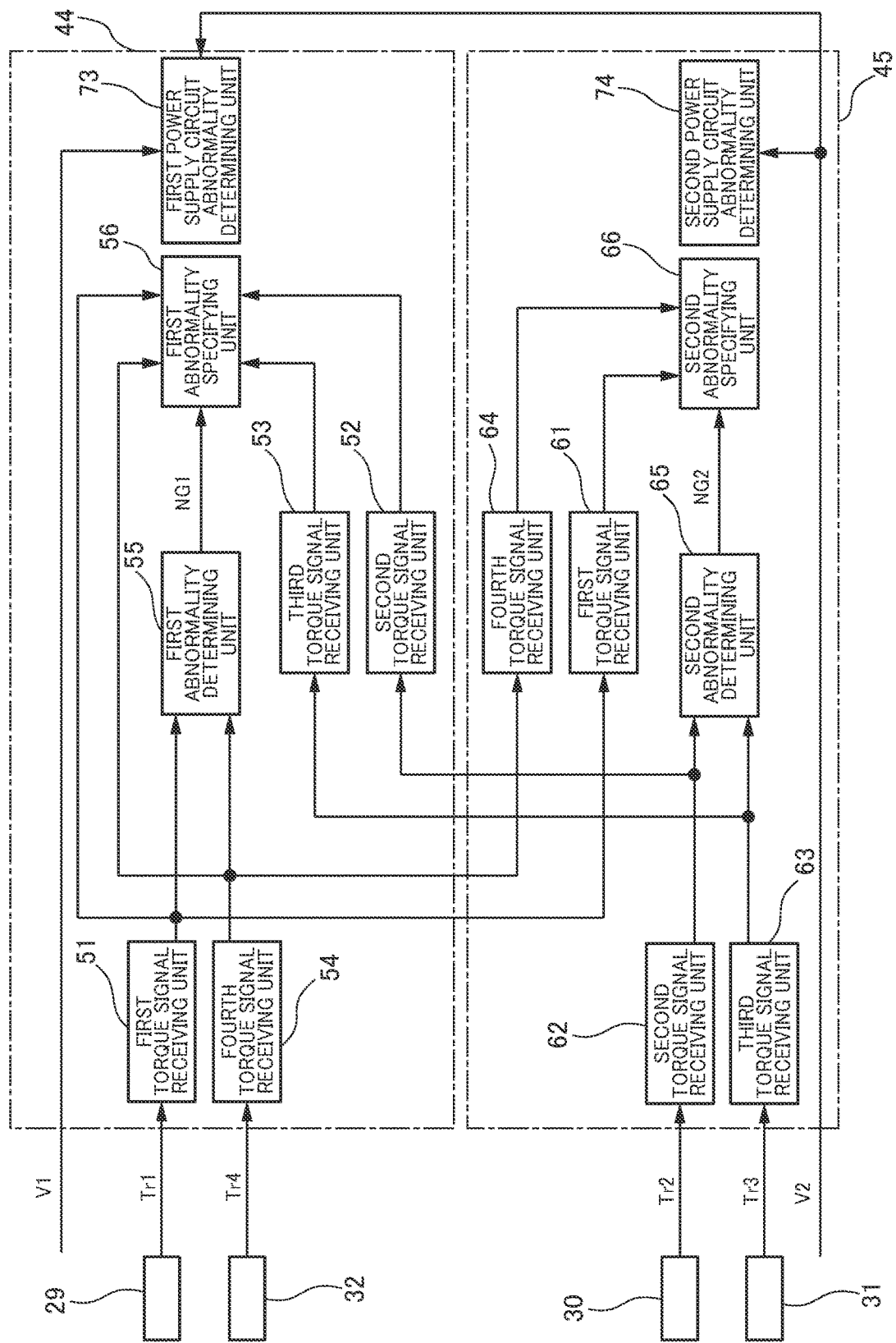
FIG. 11 is a control block diagram showing the contents of control processing by first and second processor cores of the control device according to the third embodiment.
Figure 12:
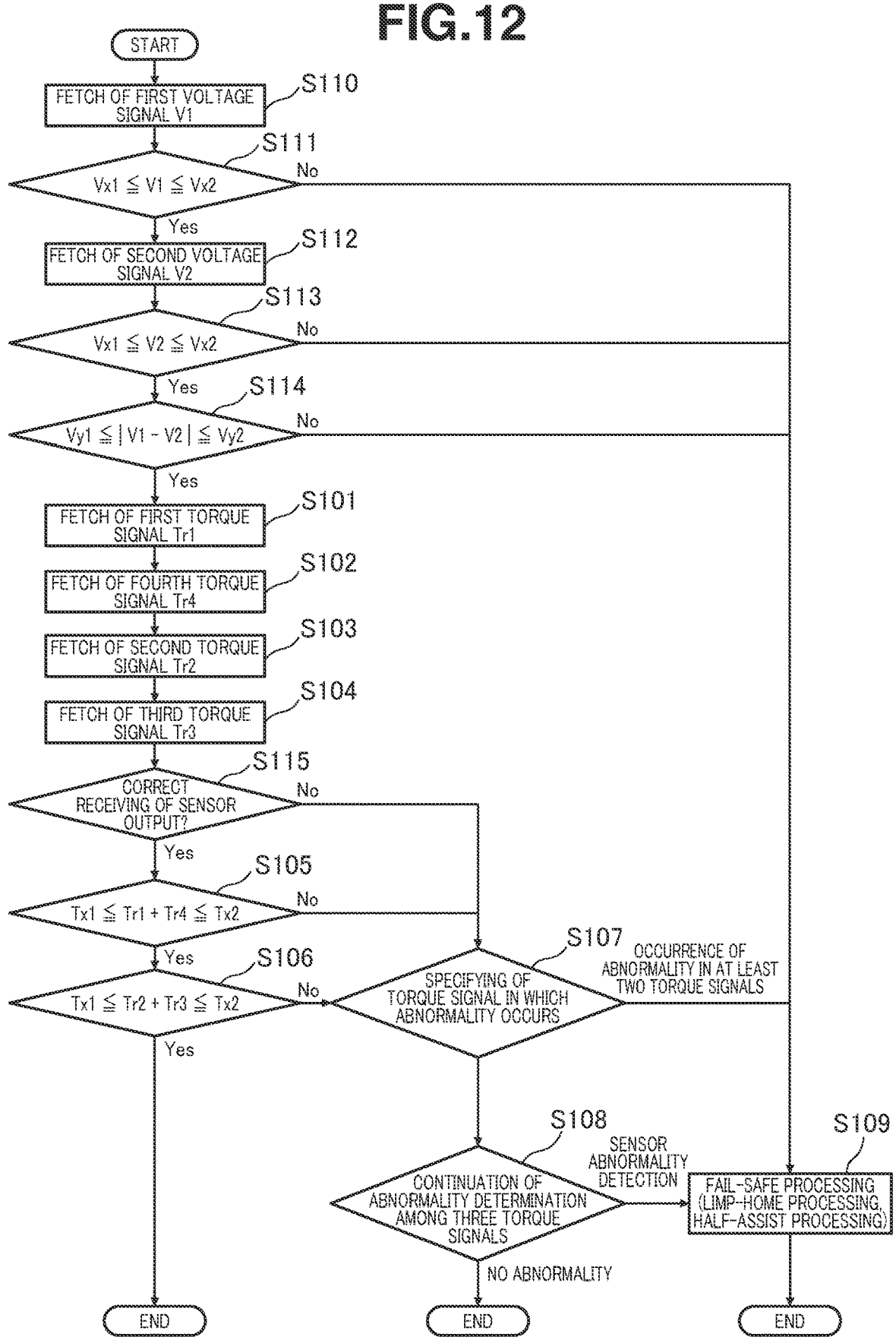
FIG. 12 is a flow chart showing abnormality determination processing of first to fourth torque signals and fail-safe processing based on the abnormality determination by the control device according to the third embodiment.

In a third embodiment of the present invention shown in each of FIG. 10 to FIG. 12, although the basic configuration of the third embodiment is substantially the same as that of the first embodiment, as shown in FIG. 10, first and second voltage monitors 71 and 72 that are first and second voltage monitoring units for detecting the voltage of power to be supplied from the first and second power supply circuits 42 and 43 to the first to the fourth Hall elements 29 to 32 are disposed on the board 41 of the control device 10.

In addition, due to the disposing of these first and second voltage monitors 71 and 72, a part of control contents of the control device 10 is changed.

The first voltage monitor 71 takes in power from the first power supply circuit 42 and derives voltage from this, and then outputs a first voltage signal V1 that is a digital signal showing this voltage to the first processor core 44.

On the other hand, the second voltage monitor 72 takes in power from the second power supply circuit 43 and derives voltage from this, and then outputs a second voltage signal V2 that is a digital signal showing this voltage to the second processor core 45.

FIG. 11 is a control block diagram showing the contents of control processing by the first and second processor cores 44 and 45 of the control device 10.

That is, the first and second processor cores 44 and 45 of the present embodiment is respectively provided with first and second power supply circuit abnormality determining units 73 and 74 for determining whether the first and second power supply circuits 42 and 43 are abnormal or not.

The first power supply circuit abnormality determining unit 73 determines whether the first voltage signal V1 output from the first power supply circuit 42 is within a predetermined range ($Vx1 \leq V1 \leq Vx2$) or not, and when the first voltage signal V1 deviates from the predetermined range, it is determined that abnormality occurs in the first power supply circuit 42.

In addition, the first power supply circuit abnormality determining unit 73 is configured to also acquire the second voltage signal V2 from the second processor core 45 through the signal transmitting unit 46.

Moreover, by also comparing the first voltage signal V1 with the second voltage signal V2, it determines whether the first and second power supply circuit 42 and 43 are abnormal or not.

More specifically, the first power supply circuit abnormality determining unit 73 takes an absolute value of the difference between the first power signal V1 and the second power signal V2, and then determines whether the absolute value of the difference is within a predetermined range ($Vy1 \leq |V1-V2| \leq Vy2$) or not. When this absolute value of the difference deviates from the predetermined range, it is determined that abnormality occurs in the first power supply circuit 42 or the second power supply circuit 43.

The second power supply circuit abnormality determining unit 74 determines whether the second voltage signal V2 output from the second power supply circuit 43 is within a predetermined range ($Vx1 \leq V2 \leq Vx2$) or not, and when the second voltage signal V2 deviates from the predetermined range, it is determined that abnormality occurs in the second power supply circuit 43.

In addition, the control device 10 of the present embodiment is configured such that when the first and second power supply circuit abnormality determining units 73 and 74 determine that abnormality occurs in the first and second power supply circuits 42 and 43, the control processing of the electric motor 7 is switched from normal processing to fail-safe processing, such as limp-home processing and half-assist processing.

FIG. 12 is a flow chart showing abnormality determination processing of the first to fourth torque signals Tr1 to Tr4 and fail-safe processing based on the abnormality determination, by the control device 10 according to the present embodiment.

That is, in the present flow, steps S110 to S114 for determining abnormality of the first and second power supply circuits 42 and 43 are added to the process before the step S101.

Specifically, in the present flow, first, the first voltage signal V1 is fetched from the first power supply circuit 42 (step S110), following which it is determined whether the first voltage signal V1 is within the predetermined range ($Vx1 \leq V1 \leq Vx2$) or not (step S111). Here, when the determination is "No", that is, it is determined that the first voltage signal V1 deviates from the predetermined range, it is determined that abnormality occurs in the first power supply circuit 42, and the process proceeds to the step S109.

On the other hand, when the determination is "Yes" in the step S111, the second voltage signal V2 is fetched from the second power supply circuit 43 (step S112), following which it is determined whether the second voltage signal V2 is within the predetermined range ($Vx1 \leq V2 \leq Vx2$) or not (step S113). Here, if the determination is "No", that is, when it is determined that the second voltage signal V2 deviates from the predetermined range, it is determined that abnormality occurs in the second power supply circuit 43, and the process proceeds to the step S109.

On the other hand, when the determination is "Yes" in the step S113, in the next step S114, the absolute value of the difference between the first voltage signal V1 and the second voltage signal V2 is taken, and it is determined whether the absolute value of the difference is within the predetermined range ($Vy1 \leq |V1-V2| \leq Vy2$) or not. Here, when the determination is "No", that is, when the absolute value of the difference deviates from the predetermined range, it is determined that abnormality occurs in the first power supply circuit 42 or the second power supply circuit 43, and the process proceeds to the step S109.

On the other hand, when the determination is "Yes" in the step S114, it is determined that both of the first and second power supply circuits 42 and 43 are normal, and the process proceeds to the step S101.

In addition, in the present flow, a step 115 for determining whether the first to fourth torque signals Tr1 to Tr4 are normally received or not is newly added to the process after the step S104.

In this step S115, by, for example, so-called CRC (Cyclic Redundancy Check), it is determined whether reception abnormality of the first to fourth torque signals Tr1 to Tr4 occurs or not.

When the reception abnormality occurs in at least one of the first to fourth torque signals Tr1 to Tr4, the process proceeds to the step S107, and when the reception abnormality does not occurs, the process proceeds to the step S105.

Therefore, according to the sensor device of the present embodiment, substantially the same working effect as that of the first embodiment can be not only obtained, but can also be determined whether the first and second power supply circuits 42 and 43 themselves are abnormal or not, because the first and second voltage monitors 71 and 72 and the first and second power supply circuit abnormality determining units 73 and 74 are provided to the control device 10. With this, reliability of the sensor device can be further improved.

In particular, in the present embodiment, since the first power circuit abnormality determining unit 73 is configured to determine the abnormality of the first and second power supply circuits 42 and 43 also based on the voltage difference between the first and second voltage signals V1 and V2, it is possible to further improve reliability of the sensor device.

In addition, since the abnormality determination of the first and second power supply circuits 42 and 43 is performed based on the voltage difference between the first and second voltage signals V1 and V2, when the voltage difference between the first and the second voltage signals V1 and V2 is included in the predetermined range even if both of the first and second voltage signals V1 and V2 deviate from the predetermined range, it can be determined that failure of both of the first and second power supply circuits 42 and 43 is caused by a common cause, such as the above-mentioned battery abnormality.

Moreover, in the present embodiment, both of the first and second voltage signals V1 and V2 respectively output by the first and second voltage monitors 71 and 72 are set to digital signals. With this, differing from a case of an analog signal, when abnormality occurs in the first and second power supply circuits 42 and 43, the first and second voltage signals V1 and V2 disappear, and by this, it is possible to easily determine the abnormality of the first and second power supply circuits 42 and 43.

In addition, in the present embodiment, since by, for example, CRC (Cyclic Redundancy Check), it is determined whether reception abnormality of the first to fourth torque signals Tr1 to Tr4 occur or not, it is possible to further improve abnormality detection accuracy of the first to fourth torque signals Tr1 to Tr4. Consequently, reliability of the sensor device can be further improved.

Fourth Embodiment

Figure 13:
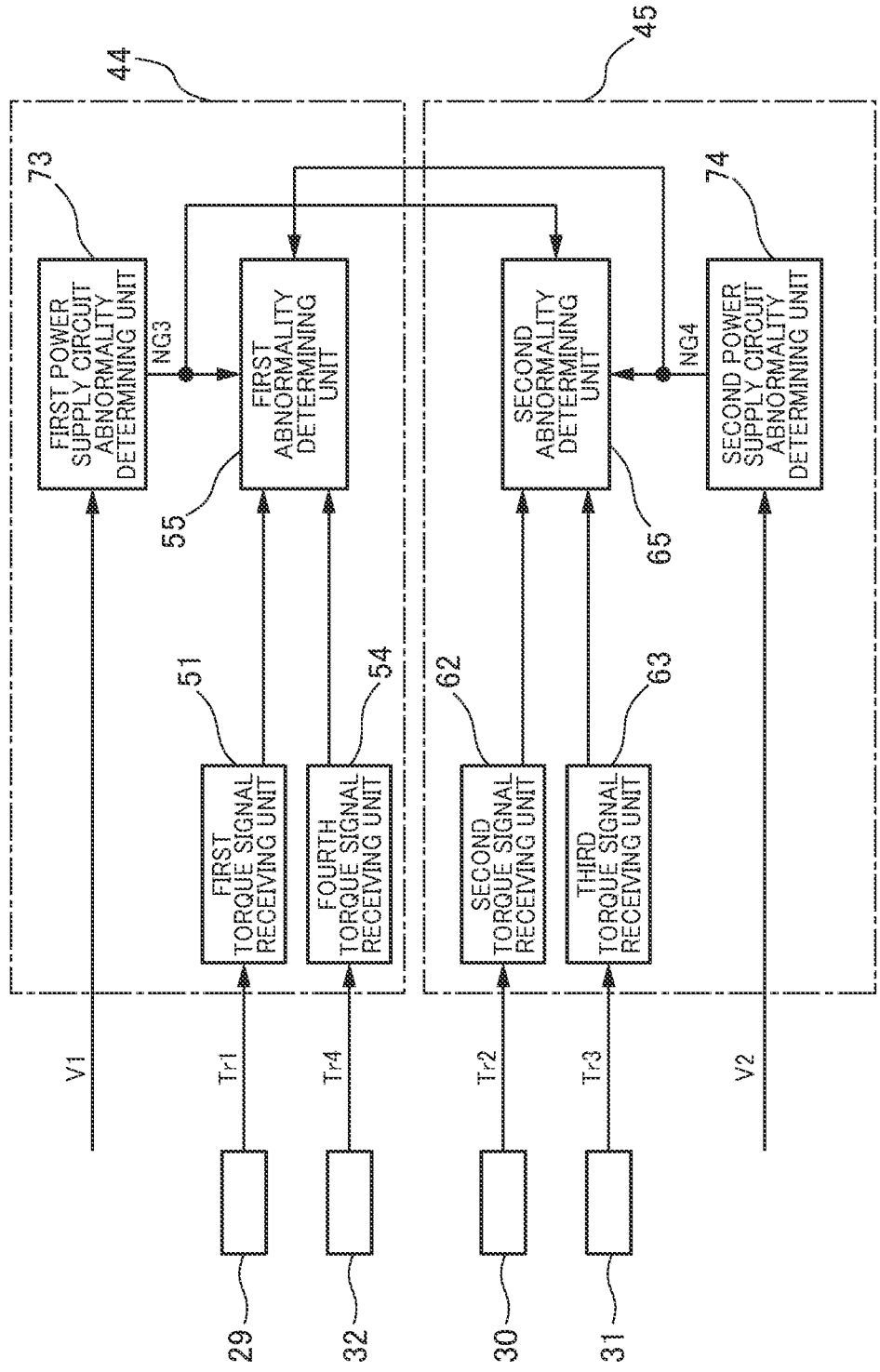
FIG. 13 is a control block diagram showing the contents of control processing by first and second processor cores of a control device according to a fourth embodiment.

In a fourth embodiment of the present invention shown in FIG. 13, although the basic configuration of the fourth embodiment is substantially the same as that of the third embodiment, a part of the contents of control processing by the first and second processor cores 44 and 45 of the control device 10 is changed.

That is, in the first processor core 44 in the present embodiment, the first abnormality specifying unit 56 is eliminated, and with this, the second and third torque signal receiving units 52 and 53 are also eliminated.

In addition, the first abnormality determining unit 55 in the present embodiment is configured so as to specify in which of the first torque signal Tr1 and the fourth torque signal Tr4 abnormality occurs, by reflecting the determination result of the first and second power supply circuit abnormality determining units 73 and 74 onto the abnormality determination of the first and fourth torque signals Tr1 and Tr4.

Specifically, the first abnormality determining unit 55 fetches the first and fourth torque signals Tr1 and Tr4, and also fetches signals NG3 and NG4 showing that the first and second power supply circuits 42 and 43 are in abnormal states from the first and second power supply circuit abnormality determining units 73 and 74.

In case where it is determined that abnormality occurs between the first and fourth torque signals Tr1 and Tr4, when the signal NG3 is output from the first power supply circuit abnormality determining unit 73, it is specified that abnormality occurs in the first torque signal Tr1.

On the other hand, in case where it is determined that abnormality occurs between the first and fourth torque signals Tr1 and Tr4, when the signal NG4 is output from the second power supply circuit determining unit 74, it is specified that abnormality occurs in the fourth torque signal Tr4.

That is, the first abnormality determining unit 55 is configured to specify in which of the first torque signal Tr1 and the fourth torque signal Tr4 abnormality occurs, based on the first torque signal Tr1, the fourth torque signal Tr4, the first voltage signal V1 and the second voltage signal V2.

On the other hand, in the second processor core 45 in the present embodiment, the second abnormality specifying unit 66 is eliminated, and with this, the first and fourth torque signal receiving units 61 and 64 are also eliminated.

In addition, the second abnormality determining unit 65 in the present embodiment is configured so as to specify in which of the second torque signal Tr2 and the third torque signal Tr3 abnormality occurs, by reflecting the determination result of the first and second power supply circuit abnormality determining units 73 and 74 onto the abnormality determination of the second and third torque signals Tr2 and Tr3.

Specifically, the second abnormality determining unit 65 fetches the second and third torque signals Tr2 and Tr3, and also fetches the signals NG3 and NG4 showing that the first and second power supply circuits 42 and 43 are in abnormal states from the first and second power supply circuit abnormality determining units 73 and 74.

In case where it is determined that abnormality occurs between the second and third torque signals Tr2 and Tr3, when the signal NG3 is output from the first power supply circuit abnormality determining unit 73, it is specified that abnormality occurs in the second torque signal Tr2.

On the other hand, in case where it is determined that abnormality occurs between the second and third torque signals Tr2 and Tr3, when the signal NG4 is output from the second power supply circuit abnormality determining unit 74, it is specified that abnormality occurs in the third torque signal Tr3.

That is, the second abnormality determining unit 65 is configured to specify in which of the second torque signal Tr2 and the third torque signal Tr3 abnormality occurs, based on the second torque signal Tr2, the third torque signal Tr3, the first voltage signal V1 and the second voltage signal V2.

In general, in a state in which it is determined that abnormality occurs in the first power supply circuit 42 by the first power supply circuit abnormality determining unit 73, when the first abnormality determining unit 55 determines that abnormality occurs in the first torque signal Tr1 or the fourth torque signals Tr4, it can be considered that the abnormality occurs in the first torque signal Tr1 output by the first Hall element 29, to which power is not normally supplied. In addition, contrary, in a state in which it is determined that abnormality occurs in the second power supply circuit 43, it can be determined that the abnormality occurs in the fourth torque signal Tr4.

In the present embodiment, since it is configured so as to perform specifying of an abnormal torque signal by the first abnormality determining unit 55 in accordance with such a situation, the specifying of the abnormal torque signal can be performed easily with high accuracy. In addition, regarding this working effect, it can be similarly obtained in the second processor 45 in which the second abnormality determining unit 65 has substantially the same configuration as that of the first abnormality determining unit 55.

Fifth Embodiment

Figure 14:
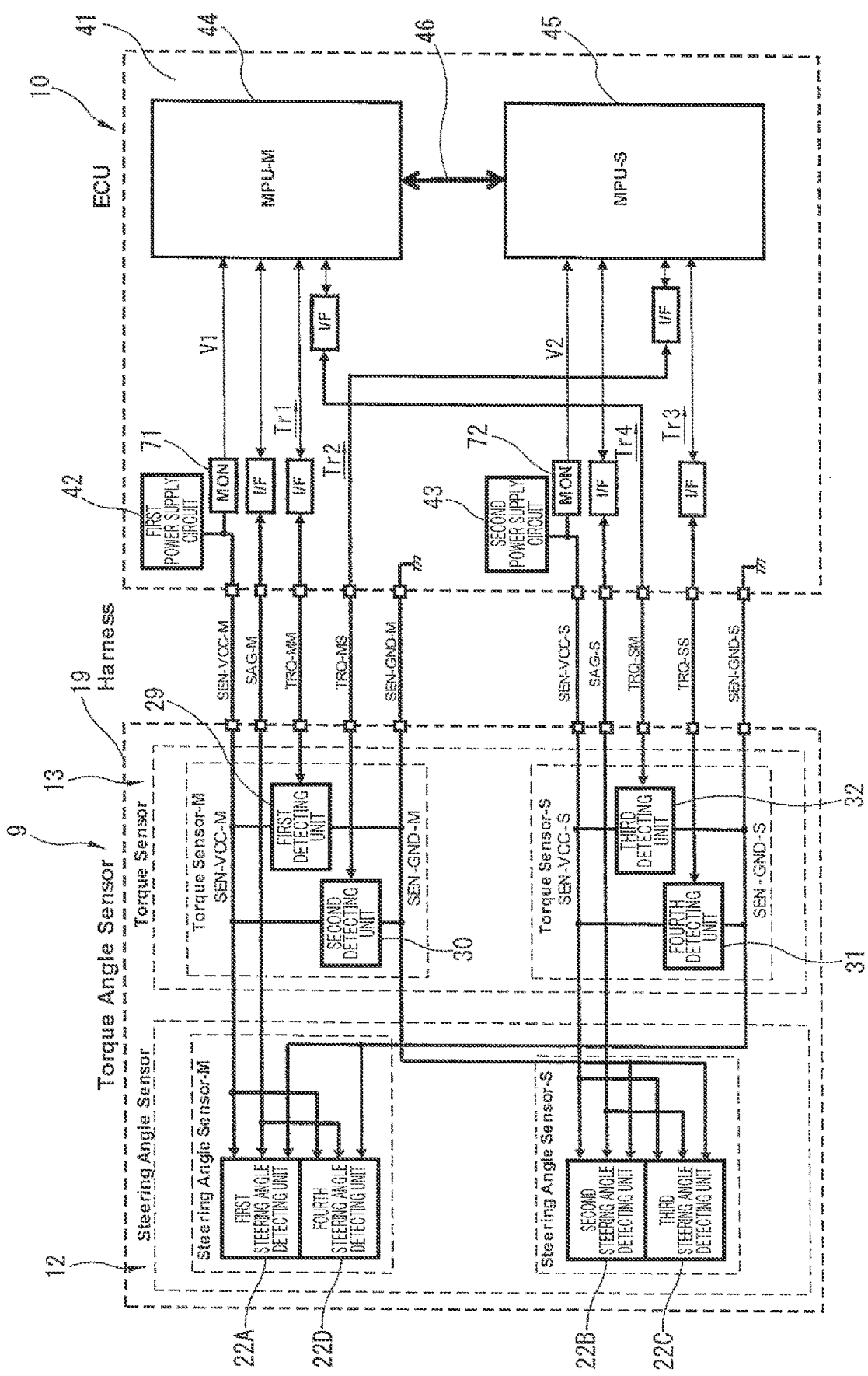
FIG. 14 is a drawing showing a specific configuration of a control device according to a fifth embodiment and a specific connection relationship between the control device and the torque sensor.

In a fifth embodiment of the present invention shown in FIG. 14, although the basic configuration of the fifth embodiment is substantially the same as that of the third embodiment, power is also supplied to the steering angle sensor 12 by the first and second power supply circuits 42 and 43.

That is, in the present embodiment, the steering angle sensor 12 is provided with four steering angle detecting units 22 each formed of a pair of the MR elements 22a and 22b.

Among them, first and fourth steering angle detecting units 22A and 22D operate based on the power supplied from the first power supply circuit 42, and second and third steering angle detecting units 22B and 22C operate based on the power supplied from the second power supply circuit 43.

In the above configuration, according to the sensor device of the present embodiment, substantially the same working effect as that of the first embodiment can be not only obtained, but also can make common a circuit for supplying power to the steering angle sensor 12 and the torque sensor, and thereby it is possible to make the conductor pattern and the like on the board 41 simple.

Sixth Embodiment

Figure 15:
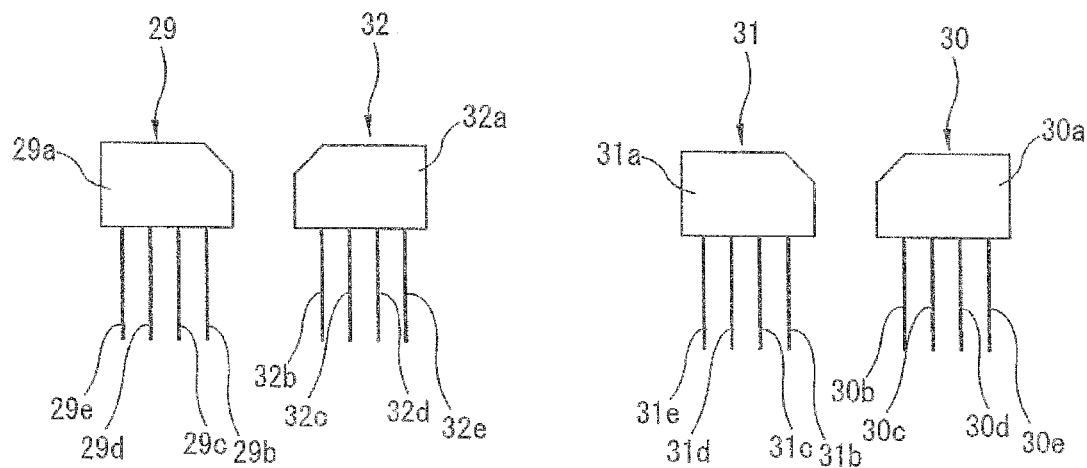
FIG. 15 is a drawing showing a position relationship of each Hall element according to a sixth embodiment.

In a sixth embodiment of the present invention shown in FIG. 15, although the basic configuration of the sixth embodiment is substantially the same as that of the first embodiment, the first to fourth Hall elements 29 to 32 each include four metal terminals (pins) and are arranged taking into consideration characteristics of the metal terminals (pins).

As the four metal terminals of the first Hall element 29, there are provided, in order from right side of FIG. 15, a test pin (ground pin) 29b to be grounded, an input pin 29c to which power is input from the first power supply circuit 42, a ground pin 29d to be grounded and an output pin 29e for outputting the first torque signal Tr1. In addition, as the four metal terminals of the fourth Hall element 32, there are provided, in order from left side of FIG. 15, a test pin (ground pin) 32b to be grounded, an input pin 32c to which power is input from the first power supply circuit 42, a ground pin 32d to be grounded and an output pin 32e for outputting the fourth torque signal Tr4.

On the other hand, as the four metal terminals of the second Hall element 30, there are provided, in order from left side of FIG. 15, a test pin (ground pin) 30b to be grounded, an input pin 30c to which power is input from the second power supply circuit 43, a ground pin 30d to be grounded and an output pin 30e for outputting the second torque signal Tr2. In addition, as the four metal terminals of the third Hall element 31, there are provided, in order from right side of FIG. 15, a test pin (ground pin) 31b to be grounded, an input pin 31c to which power is input from the second power supply circuit 43, a ground pin 31d to be grounded and an output pin 31e for outputting the third torque signal Tr3.

At this time, when the first to fourth Hall elements 29 to 32 are disposed such that the output pins 29e, 30e, 31e, 32e are arranged to be adjacent to each other, there is concern that abnormality occurs in the first to fourth torque signals Tr1 to Tr4 due to short circuit therebetween.

In particular, this concern becomes remarkable specifically in the space between the first Hall elements 29 and the fourth Hall element 32 arranged to be adjacent to each other inside the first detected section 36 and the space between the second Hall element 30 and the third Hall element 31 arranged to be adjacent to each other inside the second detected section 37.

Therefore, in the present embodiment, the first to fourth Hall elements 29 to 32 are arranged such that their corresponding output pins 29e, 30e, 31e, 32e are not adjacent to each other.

In addition, as to the first Hall element 29 and the fourth Hall element 32, the test pins 29b and 32b are arranged so as to be adjacent to each other to separate the output pins 29e and 32e from each other maximumly.

Moreover, as to the second Hall element 30 and the third Hall element 31, the test pins 30b and 31b are arranged to be adjacent to each other to separate the output pins 30e and 31e from each other maximumly.

Consequently, the short circuit between the output pins 29e, 30e, 31e and 32e is suppressed, and thereby occurrence of abnormality in the first to fourth torque signals Tr1 to Tr4 due to the short circuit can be suppressed.

In addition, at this time, although the test pins 29b and 32b are disposed at positions to be adjacent to each other and the test pins 30b and 31b are disposed at positions to be adjacent to each other, even if short circuit would occur between the test pins 29b, 30b, 31b and 32b, since there is almost no negative effect caused by the short circuit, it could be considered that there is no problem.

Similarly, as to the input pins 29c, 30c, 31c and 32c, there is almost no negative effect caused by the short circuit between the input pints 29c, 30c, 31c and 32c. Therefore, in case where each of the input pins 29c, 30c, 31c and 32c is allocated to an outside metal terminal of four metal terminals, these input pins 29c, 30c, 31c and 32c may be disposed to be adjacent to each other.

In addition, at this time, when the input pin 29c of the first Hall element 29 and the input pin 30c of the second Hall element 30 which are connected to the common first power supply circuit 42 are arranged adjacent to each other, and the input pin 31c of the third Hall element 31 and the input pin 32c of the fourth Hall element 32 which are connected to the common second power supply circuit 43 are arranged adjacent to each other, the negative affect caused by the short circuit can be further suppressed.

Figure 16:
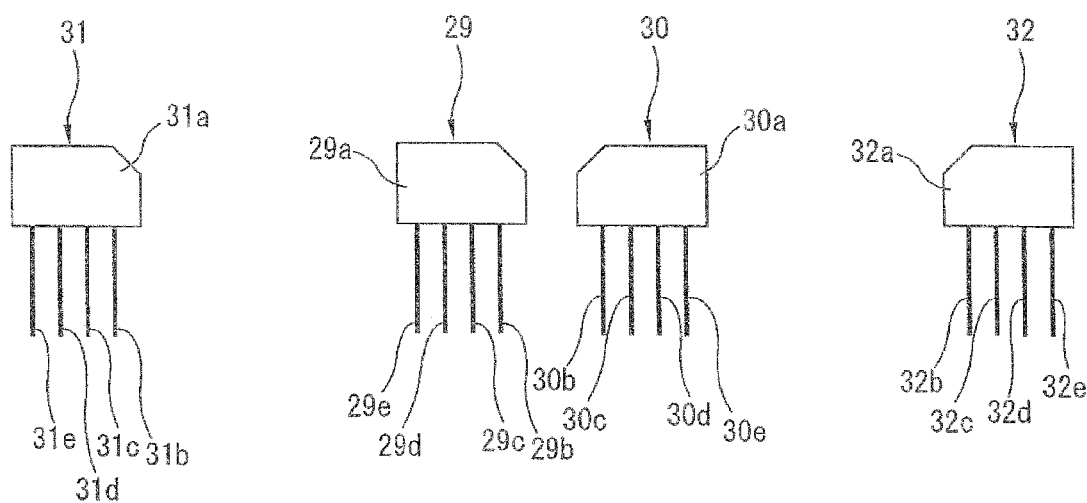
FIG. 16 is a drawing of a variation of the sixth embodiment.

FIG. 16 is a variation of the sixth embodiment, and the second and third Hall elements 30 and 31 are not arranged adjacent to each other, but are arranged apart from each other. Even in this configuration, it is possible to suppress the short circuit between the output pins 29e, 30e, 31e and 32e, and thereby the same working effect as that of the fifth embodiment can be obtained.

The present invention is not limited to the configuration of each of the embodiments, and it can be modified without departing from the scope and spirit of the present invention.

As the sensor device based on each of the embodiments explained above, for example, the following aspects can be considered.

A sensor device, in one aspect thereof, is a sensor device for detecting a predetermined state quantity in a driving condition of a vehicle, including: a first detecting unit for detecting a predetermined state quantity in a driving state of a vehicle; a second detecting unit for detecting the predetermined state quantity; a third detecting unit for detecting the predetermined state quantity; a fourth detecting unit for detecting the predetermined state quantity; a first power supply circuit for supplying power to the first detecting unit and the second detecting unit; a second power supply circuit for supplying power to the third detecting unit and the fourth detecting unit; and a control device including: a first abnormality determining unit for determining whether an output signal of the first detecting unit or an output signal of the fourth detecting unit is abnormal by comparing the output signal of the first detecting unit with the output signal of the fourth detecting unit; and a second abnormality detecting unit for determining whether an output signal of the second determining unit or an output signal of the third determining unit is abnormal by comparing the output signal of the second detecting unit with the output signal of the third detecting unit.

In another preferable aspect of the sensor device, the control device is provided with a first processor core and a second processor core, the first abnormality determining unit is provided to the first processor core, and the second abnormality determining unit is provided to the second processor core.

In another preferable aspect according to any of aspects of the sensor device, the control device is provided with a signal transmitting unit for performing signal transmission between the first processor core and the second processor core, and the control device includes an abnormality specifying unit for specifying a signal in which abnormality occurs by comparing the output signal of the first detecting unit, the output signal of the second detecting unit, the output signal of the third detecting unit and the output signal of the fourth detecting unit.

In yet another preferable aspect according to any of aspects of the sensor device, the first processor core is provided with a second detecting unit signal receiving unit for receiving the output signal of the second detecting unit and a third detecting unit signal receiving unit for receiving the output signal of the third detecting unit, and the second processor core is provided with a first detecting unit signal receiving unit for receiving the output signal of the first detecting unit and a fourth detecting unit signal receiving unit for receiving the output signal of the fourth detecting unit.

In yet another preferable aspect according to any of aspects of the sensor device, the first processor core is provided with a second detecting unit signal receiving unit for receiving the output signal of the second detecting unit, and the second processor core is provided with a fourth detecting unit signal receiving unit for receiving the output signal of the fourth detecting unit.

In yet another preferable aspect according to any of aspects of the sensor device, the control device is provided with a board on which an electronic circuit is mounted, and the first power supply circuit, the second power supply circuit, the first processor core and the second processor core are mounted on a same undivided board.

In yet another preferable aspect according to any of aspects of the sensor device, the control device includes: a first voltage monitoring unit for detecting voltage of power supplied from the first power supply circuit; a second voltage monitoring unit for detecting voltage of power supplied from the second power supply circuit; and a power supply circuit abnormality determining unit for determining whether the first power supply circuit or the second power supply circuit is abnormal, based on an output signal of the first voltage monitoring unit or an output signal of the second voltage monitoring unit.

In yet another preferable aspect according to any of aspects of the sensor device, the power supply circuit abnormality determining unit determines whether the first power supply circuit or the second power supply circuit is abnormal by comparing the output signal of the first voltage monitoring unit with the output signal of the second voltage monitoring unit.

In yet another preferable aspect according to any of aspects of the sensor device, the first abnormality determining unit is configured to specify in which of the first detecting unit signal and the fourth detecting unit signal abnormality occurs, based on the output signal of the first detecting unit, the output signal of the fourth detecting unit, the output signal of the first voltage monitoring unit and the output signal of the second voltage monitoring unit, and the second abnormality determining unit is configured to specify in which of the second detecting unit signal and the third detecting unit signal abnormality occurs, based on the output signal of the second detecting unit, the output signal of the third detecting unit, the output signal of the first voltage monitoring unit and the output signal of the second voltage monitoring unit.

In yet another preferable aspect according to any of aspects of the sensor device, the output signal of the first voltage monitoring unit and the output signal of the second voltage monitoring unit are digital signals.

In yet another preferable aspect according to any of aspects of the sensor device, the sensor device includes: a first torque detecting unit as the first detecting unit, a second torque detecting unit as the second detecting unit, a third torque detecting unit as the third detecting unit and a fourth torque detecting unit as the fourth detecting unit for detecting steering torque of a steering device of the vehicle; and a first steering angle detecting unit, a second steering angle detecting unit, a third steering angle detecting unit and a fourth steering angle detecting unit for detecting an steering angle of the steering device, wherein the first power supply circuit supplies power to the first steering angle detecting unit and the fourth steering angle detecting unit, and wherein the second power supply circuit supplies power to the second steering angle detecting unit and the third steering angle detecting unit.

In yet another preferable aspect according to any of aspects of the sensor device, the fourth detecting unit is provided so as to show a change in a decrease tendency when the output signal of the first detecting unit shows a change in an increase tendency, and show a change in an increase tendency when the output signal of the first detecting unit shows a change in a decrease tendency, and the third detecting unit is provided so as to show a change in a decrease tendency when the output signal of the second detecting unit shows a change in an increase tendency, and show a change in an increase tendency when the output signal of the second detecting unit shows a change in a decrease tendency.

In yet another preferable aspect according to any of aspects of the sensor device, each of the first detecting unit and the second detecting unit is an electronic component including a plurality of metal terminals, and the plurality of the metal terminals are formed of an input pin to which power from the first power supply circuit is supplied, a ground pin to be grounded, and of an output pin for outputting the output signal of the first detecting unit or the output signal of the second detecting unit, each of the third detecting unit and the fourth detecting unit is an electronic component including a plurality of metal terminals, and the plurality of the metal terminals are formed of an input pin to which power from the second power supply circuit is supplied, a ground pin to be grounded, and of an output pin for outputting the output signal of the third detecting unit or the output signal of the fourth detecting unit, and the first detecting unit, the second detecting unit, the third detecting unit and the fourth detecting unit are arranged such that their respective output pins are not adjacent to each other.

In yet another preferable aspect according to any of aspects of the sensor device, the first detecting unit, the second detecting unit, the third detecting unit and the fourth detecting unit are arranged such that their respective ground pins are adjacent to each other.

In yet another preferable aspect according to any of aspects of the sensor device, the first detecting unit, the second detecting unit, the third detecting unit and the fourth detecting unit are arranged such that their respective input pins are adjacent to each other.

In yet another preferable aspect according to any of aspects of the sensor device, the first detecting unit and the second detecting unit are arranged such that their respective input pins are adjacent to each other, and the third detecting unit and the fourth detecting unit are arranged such that their respective input pins are adjacent to each other.

In yet another preferable aspect according to any of aspects of the sensor device, the first detecting unit and the fourth detecting unit are arranged to be adjacent to each other, and the predetermined state quantity is detected at a common section to be detected, in members to be detected which become detection objects for detecting the predetermined state quantity, and the second detecting unit and the third detecting unit are arranged to be adjacent to each other, and the predetermined state quantity is detected at a common section to be detected, in the members to be detected.

In yet another preferable aspect according to any of aspects of the sensor device, the first detecting unit and the fourth detecting unit are mounted on a common chip, and the second detecting unit and the third detecting unit are mounted on a common chip.

The invention claimed is:

1. A sensor device for detecting a predetermined state quantity in a driving condition of a vehicle, comprising: a first detecting unit for detecting the predetermined state quantity in a driving state of the vehicle; a second detecting unit for detecting the predetermined state quantity; a third detecting unit for detecting the predetermined state quantity; a fourth detecting unit for detecting the predetermined state quantity; a first power supply circuit for supplying power to the first detecting unit and the second detecting unit; a second power supply circuit for supplying power to the third detecting unit and the fourth detecting unit; and a control device including: a first abnormality determining unit for determining whether an output signal of the first detecting unit or an output signal of the fourth detecting unit is abnormal by comparing the output signal of the first detecting unit with the output signal of the fourth detecting unit; and a second abnormality detecting unit for determining whether an output signal of the second determining unit or an output signal of the third determining unit is abnormal by comparing the output signal of the second detecting unit with the output signal of the third detecting unit.

2. The sensor device according to claim 1, wherein the control device is provided with a first processor core and a second processor core,
wherein the first abnormality determining unit is provided to the first processor core, and
wherein the second abnormality determining unit is provided to the second processor core.

3. The sensor device according to claim 2, wherein the control device is provided with a signal transmitting unit for performing signal transmission between the first processor core and the second processor core, and
wherein the control device includes an abnormality specifying unit for specifying a signal in which abnormality occurs by comparing the output signal of the first detecting unit, the output signal of the second detecting unit, the output signal of the third detecting unit and the output signal of the fourth detecting unit.

4. The sensor device according to claim 2, wherein the first processor core is provided with a second detecting unit signal receiving unit for receiving the output signal of the second detecting unit and a third detecting unit signal receiving unit for receiving the output signal of the third detecting unit, and
wherein the second processor core is provided with a first detecting unit signal receiving unit for receiving the output signal of the first detecting unit and a fourth detecting unit signal receiving unit for receiving the output signal of the fourth detecting unit.

5. The sensor device according to claim 2, wherein the first processor core is provided with a second detecting unit signal receiving unit for receiving the output signal of the second detecting unit, and
wherein the second processor core is provided with a fourth detecting unit signal receiving unit for receiving the output signal of the fourth detecting unit.

6. The sensor device according to claim 5, wherein the control device is provided with a board on which an electronic circuit is mounted, and
wherein the first power supply circuit, the second power supply circuit, the first processor core and the second processor core are mounted on a same undivided board.

7. The sensor device according to claim 1, wherein the control device includes:
a first voltage monitoring unit for detecting voltage of power supplied from the first power supply circuit;
a second voltage monitoring unit for detecting voltage of power supplied from the second power supply circuit; and
a power supply circuit abnormality determining unit for determining whether the first power supply circuit or the second power supply circuit is abnormal, based on an output signal of the first voltage monitoring unit or an output signal of the second voltage monitoring unit.

8. The sensor device according to claim 7, wherein the power supply circuit abnormality determining unit determines whether the first power supply circuit or the second power supply circuit is abnormal by comparing the output signal of the first voltage monitoring unit with the output signal of the second voltage monitoring unit.

9. The sensor device according to claim 7, wherein the first abnormality determining unit is configured to specify in which of the first detecting unit signal and the fourth detecting unit signal abnormality occurs, based on the output signal of the first detecting unit, the output signal of the fourth detecting unit, the output signal of the first voltage monitoring unit and the output signal of the second voltage monitoring unit, and wherein the second abnormality determining unit is configured to specify in which of the second detecting unit signal and the third detecting unit signal abnormality occurs, based on the output signal of the second detecting unit, the output signal of the third detecting unit, the output signal of the first voltage monitoring unit and the output signal of the second voltage monitoring unit.

10. The sensor device according to claim 9, wherein the output signal of the first voltage monitoring unit and the output signal of the second voltage monitoring unit are digital signals.

11. The sensor device according to claim 1, comprising: a first torque detecting unit as the first detecting unit, a second torque detecting unit as the second detecting unit, a third torque detecting unit as the third detecting unit and a fourth torque detecting unit as the fourth detecting unit for detecting steering torque of a steering device of the vehicle; and a first steering angle detecting unit, a second steering angle detecting unit, a third steering angle detecting unit and a fourth steering angle detecting unit for detecting a steering angle of the steering device, wherein the first power supply circuit supplies power to the first steering angle detecting unit and the fourth steering angle detecting unit, and wherein the second power supply circuit supplies power to the second steering angle detecting unit and the third steering angle detecting unit.

12. The sensor device according to claim 1, wherein the fourth detecting unit is provided such that the output signal of the fourth detecting unit shows a change in a decrease tendency when the output signal of the first detecting unit shows a change in an increase tendency, and the output signal of the fourth detecting unit shows a change in an increase tendency when the output signal of the first detecting unit shows a change in a decrease tendency, and wherein the third detecting unit is provided such that the output signal of the third detecting unit shows a change in a decrease tendency when the output signal of the second detecting unit shows a change in an increase tendency, and the output signal of the third detecting unit shows a change in an increase tendency when the output signal of the second detecting unit shows a change in a decrease tendency.

13. The sensor device according to claim 1, wherein each of the first detecting unit and the second detecting unit is an electronic component including a plurality of metal terminals, and the plurality of the metal terminals are formed of an input pin to which power from the first power supply circuit is supplied, a ground pin to be grounded, and of an output pin for outputting the output signal of the first detecting unit or the output signal of the second detecting unit, wherein each of the third detecting unit and the fourth detecting unit is an electronic component including a plurality of metal terminals, and the plurality of the metal terminals are formed of an input pin to which power from the second power supply circuit is supplied, a ground pin to be grounded, and of an output pin for outputting the output signal of the third detecting unit or the output signal of the fourth detecting unit, and wherein the first detecting unit, the second detecting unit, the third detecting unit and the fourth detecting unit are arranged such that their respective output pins are not adjacent to each other.

14. The sensor device according to claim 13, wherein the first detecting unit, the second detecting unit, the third detecting unit and the fourth detecting unit are arranged such that their respective ground pins are adjacent to each other.

15. The sensor device according to claim 13, wherein the first detecting unit, the second detecting unit, the third detecting unit and the fourth detecting unit are arranged such that their respective input pins are adjacent to each other.

16. The sensor device according to claim 15, wherein the first detecting unit and the second detecting unit are arranged such that their respective input pins are adjacent to each other, and wherein the third detecting unit and the fourth detecting unit are arranged such that their respective input pins are adjacent to each other.

17. The sensor device according to claim 13, wherein the first detecting unit and the fourth detecting unit are arranged to be adjacent to each other, and the predetermined state quantity is detected at a common section to be detected, in members to be detected which become detection objects for detecting the predetermined state quantity, and wherein the second detecting unit and the third detecting unit are arranged to be adjacent to each other, and the predetermined state quantity is detected at a common section to be detected, in the members to be detected.

18. The sensor device according to claim 1, wherein the first detecting unit and the fourth detecting unit are mounted on a common chip, and wherein the second detecting unit and the third detecting unit are mounted on a common chip.

* * * * *